US012660425B2

(12) United States Patent
Lim et al.

(10) Patent No.: US 12,660,425 B2
(45) Date of Patent: Jun. 16, 2026

(54) DISPLAY DEVICE

(71) Applicant: Samsung Display Co., LTD., Yongin-si (KR)

(72) Inventors: Sang Hyung Lim, Yongin-si (KR); Se Jin Park, Yongin-si (KR); Jae Ho Eo, Yongin-si (KR); Soon Mi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 18/340,760

(22) Filed: Jun. 23, 2023

(65) Prior Publication Data

US 2024/0099071 A1 Mar. 21, 2024

(30) Foreign Application Priority Data

Sep. 20, 2022 (KR) ........................ 10-2022-0118233

(51) Int. Cl.
H10K 59/122 (2023.01)
H10K 59/38 (2023.01)
H10K 59/80 (2023.01)

(52) U.S. Cl.
CPC ........... H10K 59/122 (2023.02); H10K 59/38 (2023.02); H10K 59/873 (2023.02); H10K 59/879 (2023.02)

(58) Field of Classification Search
CPC .. H10K 59/122; H10K 59/879; H10K 59/873; H10K 59/38
USPC ....................................................... 313/500
See application file for complete search history.

(56) References Cited

U.S. PATENT DOCUMENTS

| | | | |
|---|---|---|---|
| 7,659,662 B2 | 2/2010 | Song et al. | |
| 11,393,880 B2 | 7/2022 | Jang et al. | |
| 11,574,970 B2 | 2/2023 | Kim et al. | |
| 11,974,455 B2 | 4/2024 | Yeo et al. | |
| 2019/0348482 A1 * | 11/2019 | Bae ...................... | H10K 59/124 |
| 2020/0274089 A1 * | 8/2020 | Son ....................... | H10K 59/38 |
| 2021/0036076 A1 | 2/2021 | Kim et al. | |
| 2022/0285465 A1 | 9/2022 | Kang et al. | |
| 2024/0298499 A1 | 9/2024 | Kang et al. | |

FOREIGN PATENT DOCUMENTS

| | | |
|---|---|---|
| KR | 10-2006-0095718 A | 9/2006 |
| KR | 10-1570535 B1 | 11/2015 |
| KR | 10-2021-0014233 A | 2/2021 |
| KR | 10-2022-0087611 A | 6/2022 |
| KR | 10-2022-0099595 A | 7/2022 |
| KR | 10-2022-0125828 A | 9/2022 |

OTHER PUBLICATIONS

K-PION Patent File Wrapper Search (Year: 2022).*

* cited by examiner

*Primary Examiner* — James R Greece
*Assistant Examiner* — Hana S Featherly
(74) *Attorney, Agent, or Firm* — Womble Bond Dickinson (US) LLP

(57) ABSTRACT

A display device includes a first substrate, a first electrode above the first substrate, a pixel-defining film above the first electrode, and defining an emission area, a light-emitting layer above the first electrode and the pixel-defining film, a second electrode above the light-emitting layer, a thin-film encapsulation structure above the second electrode, and including an organic film defining an opening, and a color control layer above the thin-film encapsulation structure in the opening.

20 Claims, 27 Drawing Sheets

NDA: NDA1, NDA2, NDA3, NDA4

CFL: CF1, CF2, CF3
WCL1: WCP1, BRS1, SCP
WCL2: WCP2, BRS2, SCP
TPL: BRS3, SCP
CCR: WCL1, WCL2, TPL

172     PDL

SPX1          SPX2          SPX3

NLA | LA1 | NLA | LA2 | NLA | LA3 | NLA 160
171
CME
EML          EMD

PDL

ANO
VIA
PV
IL
BL2
BL1

SUB

BML
D1 ACT G1 S1
GI
T1

Figure 9:
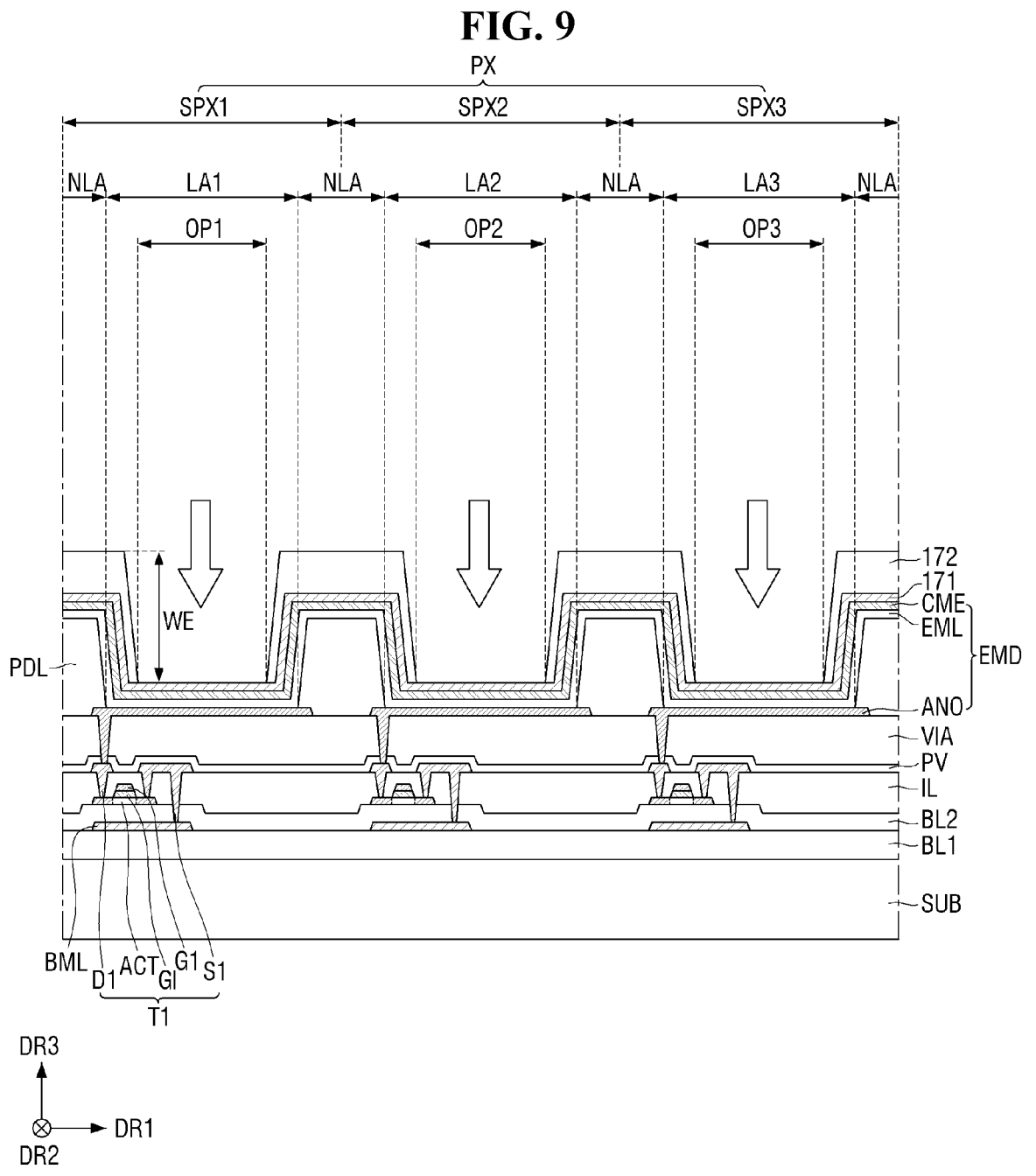

SPX1     SPX2     SPX3

NLA     LA1     NLA     LA2     NLA     LA3     NLA

OP1     OP2     OP3

WE

PDL 172
171
CME
EML     EMD
ANO
VIA
PV
IL
BL2
BL1
SUB

BML
D1   ACT   G1   S1
GI
T1

Figure 10:
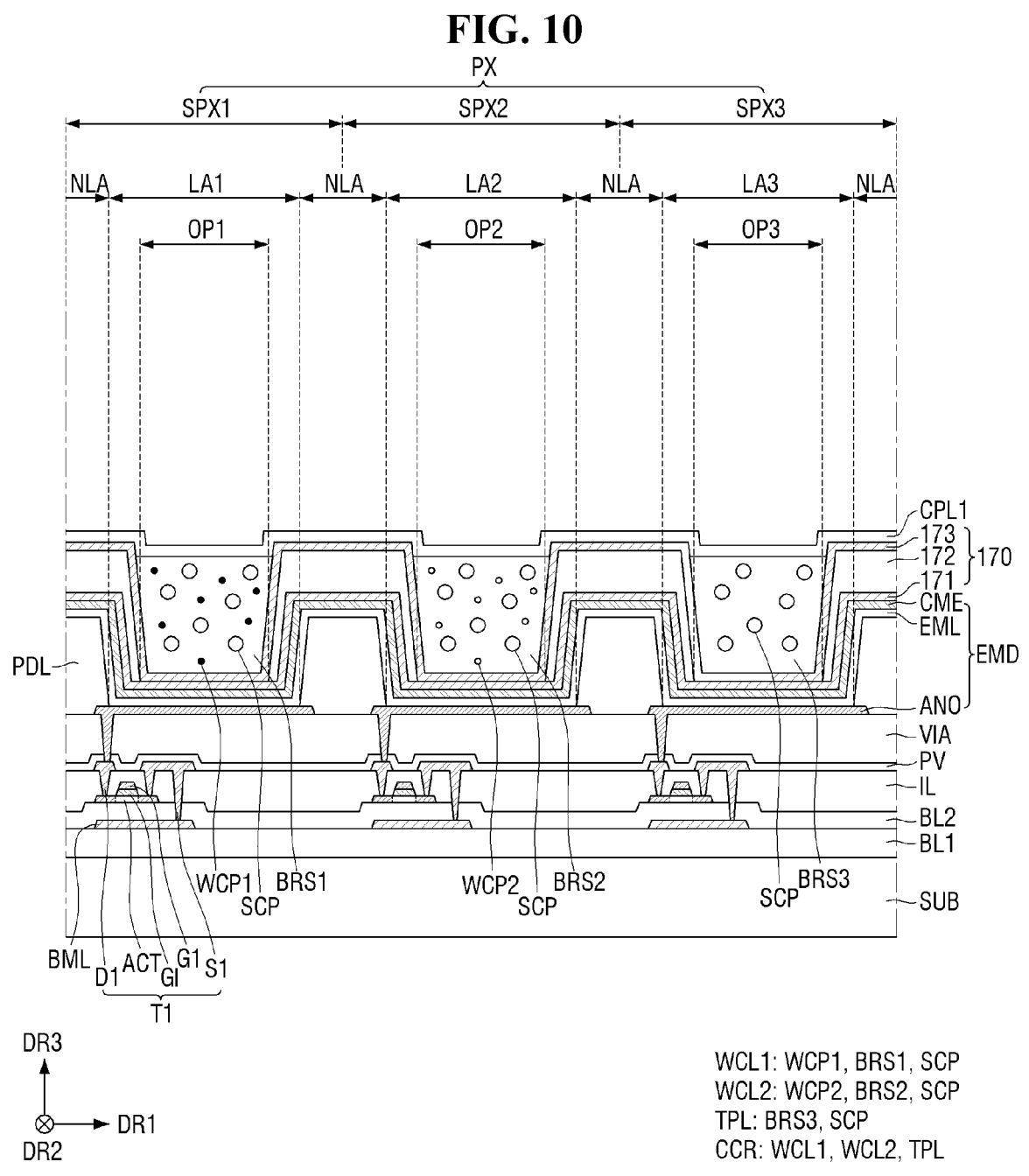

SPX1     SPX2     SPX3

NLA     LA1     NLA     LA2     NLA     LA3     NLA

OP1     OP2     OP3

CPL1
173
172  } 170
171
CME
EML } EMD

PDL

ANO

VIA
PV
IL
BL2
BL1

WCP1  BRS1     WCP2  BRS2     BRS3
SCP          SCP          SCP
SUB

BML
D1 ACT G1 S1
GI
T1

DR3
↑
⊗ → DR1
DR2

WCL1: WCP1, BRS1, SCP
WCL2: WCP2, BRS2, SCP
TPL: BRS3, SCP
CCR: WCL1, WCL2, TPL

CFL: CF1, CF2, CF3
WCL1: WCP1, BRS1, SCP
WCL2: WCP2, BRS2, SCP
TPL: BRS3, SCP
CCR: WCL1, WCL2, TPL

Figure 13:
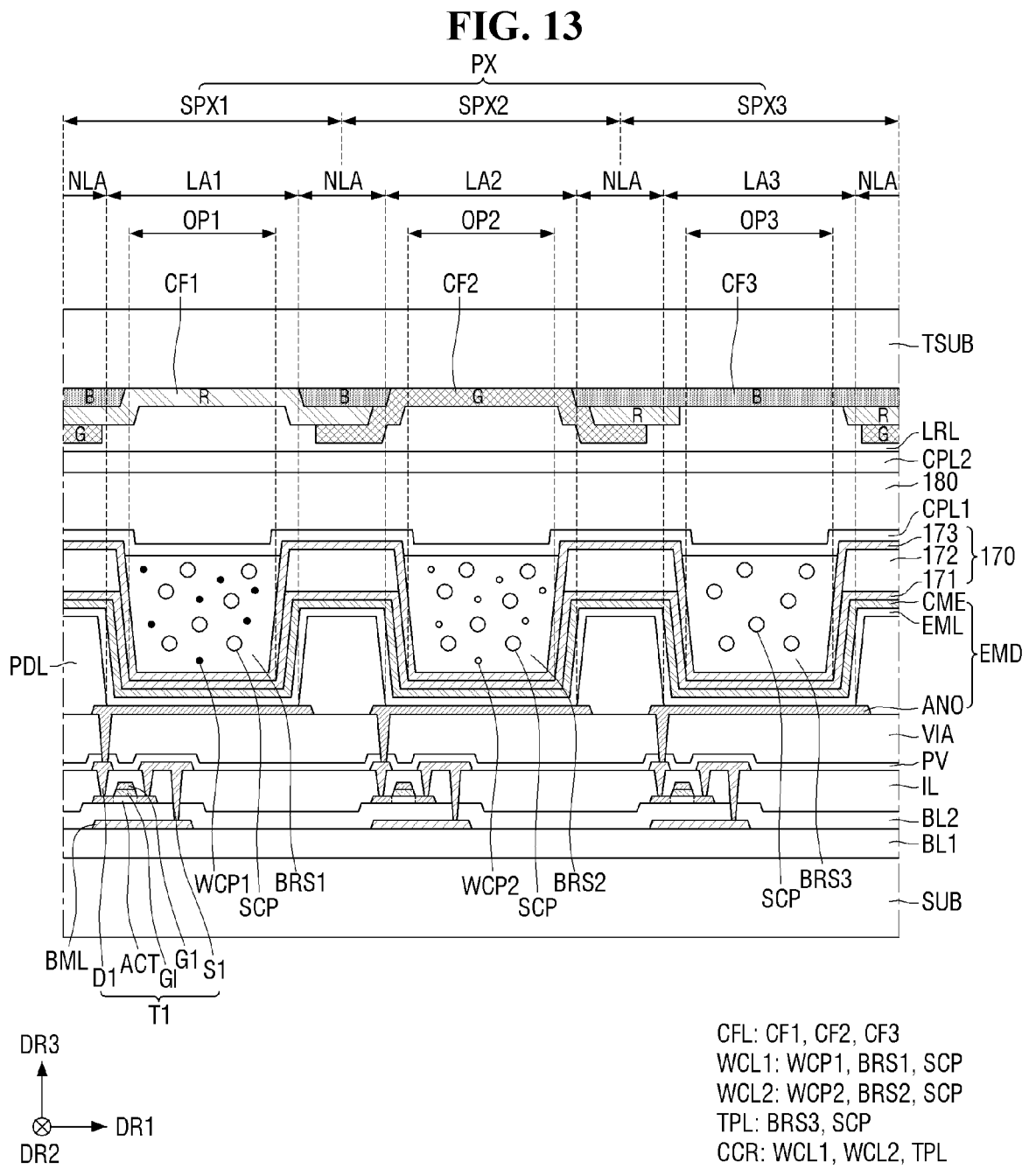

SPX1    SPX2    SPX3

NLA    LA1    NLA    LA2    NLA    LA3    NLA

OP1    OP2    OP3

CF1    CF2    CF3

TSUB

B    R    B    G    R    B

G    R    R    LRL
G    G    CPL2
180
CPL1
173
172    170
171
CME
EML
EMD
PDL
ANO
VIA
PV
IL
BL2
BL1

WCP1 | BRS1    WCP2 | BRS2    BRS3    SUB
SCP    SCP    SCP

BML    D1 ACT G1 S1
GI
T1

DR3

DR2    DR1

CFL: CF1, CF2, CF3
WCL1: WCP1, BRS1, SCP
WCL2: WCP2, BRS2, SCP
TPL: BRS3, SCP
CCR: WCL1, WCL2, TPL

DR3
↑
⊗ → DR1
DR2

CFL: CF1, CF2, CF3
WCL1: WCP1, BRS1, SCP
WCL2: WCP2, BRS2, SCP
TPL: BRS3, SCP
CCR: WCL1, WCL2, TPL

DR3
↑
⊗ → DR1
DR2

CFL: CF1, CF2, CF3
WCL1: WCP1, BRS1, SCP
WCL2: WCP2, BRS2, SCP
TPL: BRS3, SCP
CCR: WCL1, WCL2, TPL

FIG. 16

CFL: CF1, CF2, CF3
WCL1: WCP1, BRS1, SCP
WCL2: WCP2, BRS2, SCP
TPL: BRS3, SCP
CCR: WCL1, WCL2, TPL

LEN

GR1
172
SS
LEN

CFL: CF1, CF2, CF3
WCL1: WCP1, BRS1, SCP
WCL2: WCP2, BRS2, SCP
TPL: BRS3, SCP
CCR: WCL1, WCL2, TPL

PX

| SPX1 | SPX2 | SPX3 |
|---|---|---|

| NLA | LA1 | NLA | LA2 | NLA | LA3 | NLA |
|---|---|---|---|---|---|---|

PDL
ANO
VIA
PV
IL
BL2
BL1

SUB

BML
D1 ACT G1 S1
GI
T1

VIH1 VIH2 VIH3

CFL: CF1, CF2, CF3
WCL1: WCP1, BRS1, SCP
WCL2: WCP2, BRS2, SCP
TPL: BRS3, SCP
CCR: WCL1, WCL2, TPL

FIG. 25

LA1, ANO
OP1

LA2, ANO
OP2

LA3, ANO
OP3

172 PDL

VIH1

PH1

VIH2

PH2

VIH3

PH3

DR2

DR1

DR3

PX

SPX1          SPX2          SPX3

NLA    LA1    NLA    LA2    NLA    LA3    NLA

PDL
ANO
VIA
PV
IL
BL2
BL1

SUB

BML
D1  ACT  G1  S1
GI
T1

PH1          PH2          PH3

DR3
DR2  DR1

DISPLAY DEVICE

CROSS-REFERENCE TO RELATED APPLICATION

This application claims priority to and the benefit of Korean Patent Application No. 10-2022-0118233 filed on Sep. 20, 2022 in the Korean Intellectual Property Office, the disclosure of which is incorporated herein by reference in its entirety.

BACKGROUND

1. Field

The present disclosure relates to a display device.

2. Description of the Related Art

As the information-oriented society evolves, various demands for display devices are ever increasing. For example, display devices are being employed by a variety of electronic devices, such as smart phones, digital cameras, laptop computers, navigation devices, and smart televisions. Display devices may be flat panel display devices, such as a liquid-crystal display device, a field emission display device, and an organic light-emitting display device.

Among such flat panel display devices, a light-emitting display device includes a light-emitting element that can emit light on its own, so that each of the pixels of the display panel can emit light by themselves. Accordingly, a light-emitting display device can display images without a back-light unit that supplies light to the display panel. Among light-emitting display devices, an organic light-emitting device may include two opposing electrodes and a light-emitting layer interposed therebetween. Electrons and holes supplied from the two electrodes are recombined in the light-emitting layer to generate excitons, the generated excitons relax from the excited state to the ground state, and accordingly light can be emitted.

Such a light-emitting display device does not require a separate light source, and thus it consumes less power, and can be made light and thin, as well as exhibiting high-quality characteristics, such as wide viewing angle, high luminance and contrast, and fast response speed. Accordingly, organic light-emitting display devices are attracting attention as the next generation display device.

SUMMARY

Aspects of the present disclosure provide a display device capable of reducing or preventing deterioration of an emission layer.

It should be noted that aspects of the present disclosure are not limited to the above-mentioned aspect; and other aspects of the present disclosure will be apparent to those skilled in the art from the following descriptions.

According to an aspect of the present disclosure, a display device includes a first substrate, a first electrode above the first substrate, a pixel-defining film above the first electrode, and defining an emission area, a light-emitting layer above the first electrode and the pixel-defining film, a second electrode above the light-emitting layer, a thin-film encapsulation structure above the second electrode, and including an organic film defining an opening, and a color control layer above the thin-film encapsulation structure in the opening.

The opening may overlap the emission area, and may be smaller than the emission area.

The thin-film encapsulation structure may further include a first inorganic film above the second electrode, and a second inorganic film above the organic film and covering the opening.

The opening may expose an upper surface of the first inorganic film that is in contact with the second inorganic film.

The opening may correspond to a well space having a depth from an upper surface of the organic film to an upper surface of the first inorganic film.

The color control layer may be above the second inorganic film in the well space.

The organic film may cover an upper surface and side surfaces of the pixel-defining film.

The thin-film encapsulation structure may further include a via layer above the first substrate and the first electrode, and defining a via groove overlapping the emission area.

An area of the via groove may be greater than an area of the emission area and may be greater than an area of the opening.

The first electrode may be in the via groove, wherein an area of the via groove is greater than or equal to an area of the first electrode.

The pixel-defining film may define a pixel hole that exposes the via groove and the first electrode, and does not overlap with the via groove.

The display device may further include a low-refractive layer above the thin-film encapsulation structure, a capping layer above the low-refractive layer, a color filter layer above the capping layer, and an overcoat layer above the color filter layer.

The color control layer may include a wavelength conversion layer for converting a wavelength of light, or a transparent layer for transmitting light.

The display device may further include a second substrate opposite the first substrate, a color filter layer above a surface of the second substrate, and a filling layer between the color filter layer and the thin-film encapsulation structure.

According to an aspect of the present disclosure, a display device includes a substrate, a first electrode above the substrate, a pixel-defining film above the first electrode, and defining an emission area, a light-emitting layer above the first electrode and the pixel-defining film, a second electrode above the light-emitting layer, a thin-film encapsulation structure above the second electrode, and including an organic film defining a groove, and a color control layer above the thin-film encapsulation structure and in the groove.

The groove may overlap with the emission area, and may correspond to a well space having a depth from a top surface of the organic film to a bottom surface of the organic film, wherein the color control layer is in the well space.

A bottom surface of the groove may include at least one protrusion including a micro lens shape.

According to an aspect of the present disclosure, a display device includes a substrate, a pixel-defining film above the substrate, and defining emission areas, light-emitting elements respectively in the emission areas, and including a first electrode, a light-emitting layer, and a second electrode, a thin-film encapsulation structure above the light-emitting elements, and including an organic film having well structures respectively overlapping the emission areas, and a color control layer above the thin-film encapsulation structure and in one or more of the well structures.

The well structures may correspond to openings or grooves of the organic film.

The emission areas may include a first emission area, a second emission area, and a third emission area, wherein the color control layer includes a first wavelength conversion layer, a second wavelength conversion layer, and a transparent layer, and wherein the first wavelength conversion layer is in the well structure of the first emission area, the second wavelength conversion layer is in the well structure of the second emission area, and the transparent layer is in the well structure of the third emission area.

According to one or more embodiments of the present disclosure, by forming an organic film including an opening or a groove in which a color control layer is located, it is possible to reduce or prevent deterioration of a light-emitting layer and outgassing of an organic material in a display device.

It should be noted that aspects of the present disclosure are not limited to those described above and other aspects of the present disclosure will be apparent to those skilled in the art from the following descriptions.

BRIEF DESCRIPTION OF THE DRAWINGS

The above and other aspects of the present disclosure will become more apparent by describing in detail embodiments thereof with reference to the attached drawings, in which:

FIG. 4 is a plan view showing a pixel of a display device according to one or more embodiments of the present disclosure.

FIG. 5 is a cross-sectional view taken along the line Q1-Q1' of FIG. 4.

FIG. 6 is a plan view showing emission areas and openings of one pixel of a display device.

FIGS. 7 to 12 are cross-sectional views showing processing steps of fabricating a display device according to one or more embodiments of the present disclosure.

FIG. 13 is a cross-sectional view showing a pixel of a display device according to one or more other embodiments of the present disclosure.

FIG. 16 is a cross-sectional view showing a process of fabricating the organic film of FIG. 15.

FIGS. 18 and 19 are cross-sectional views showing examples of grooves in an organic film.

FIG. 20 is a cross-sectional view showing a process of fabricating the organic film of FIG. 17.

FIG. 24 is a cross-sectional view showing a pixel of a display device according to yet one or more other embodiments of the present disclosure.

FIG. 25 is a plan view showing one pixel of FIG. 24.

DETAILED DESCRIPTION

Figure 1:
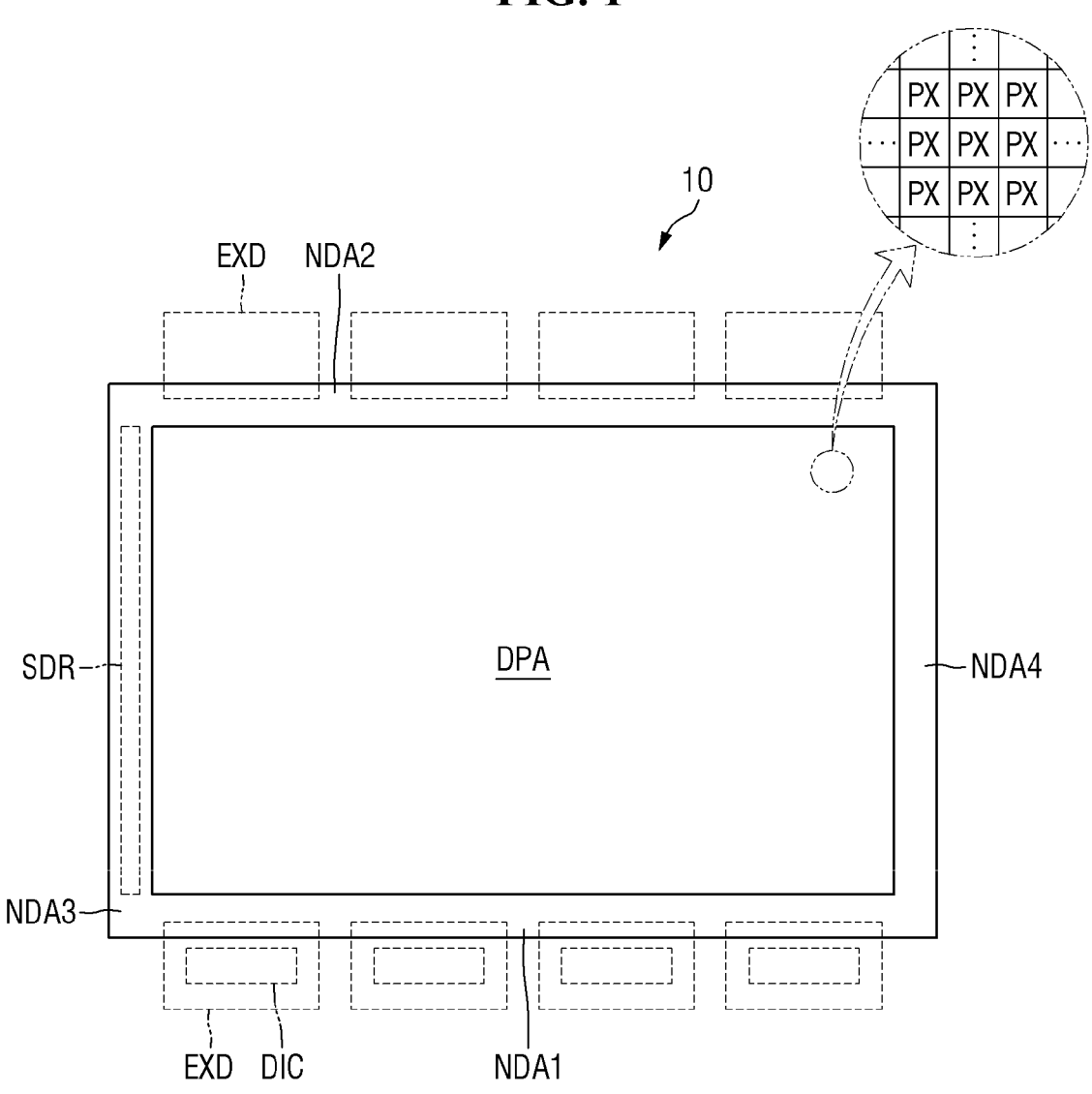
FIG. 1 is a plan view of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region.

Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device according to one or more embodiments of the present disclosure.

Referring to FIG. 1, a display device 10 according to one or more embodiments of the present disclosure may be applied to, a smart phone, a mobile phone, a tablet PC, a personal digital assistant (PDA), a portable multimedia player (PMP), a television set, a game machine, a wrist-watch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances, such as a refrigerator and a laundry machine, Internet of things (IoT) devices, etc. In the following description, a television is described as an example of the display device. TV may have a high resolution or ultra-high resolution, such as HD, UHD, 4K and 8K.

In addition, the display device 10 according to one or more embodiments may be variously classified by the way in which images are displayed. Examples of the classification of display devices may include an organic light-emitting display device (OLED), an inorganic light-emitting display device (inorganic EL), a quantum-dot light-emitting display device (QED), a micro LED display device (micro-LED), a nano LED display device (nano-LED), a plasma display device (PDP), a field emission display device (FED) and a cathode ray display device (CRT), a liquid-crystal display device (LCD), an electrophoretic display device (EPD), etc. In the following description, an organic light-emitting display device will be described as an example of the display device, and the organic light-emitting display device will be simply referred to as a display device unless it is suitable to discern it from others. It is, however, to be understood that the embodiments of the present disclosure are not limited to the organic light-emitting display device, and one of the above-listed display devices or any other display device well known in the art may be employed without departing from the scope of the present disclosure.

According to one or more embodiments of the present disclosure, the display device 10 may have a rectangular or square shape when viewed from the top. When the display device 10 is a television, it is oriented such that the longer sides are positioned in the horizontal direction. It should be understood, however, that the present disclosure is not limited thereto. The longer side may be positioned in the vertical direction. Alternatively, the display device 1 may be installed rotatably so that the longer sides are positioned in the horizontal or vertical direction variably.

The display device 10 may include a display area DPA and a non-display area NDA. The display area DPA may be an active area where images are displayed. The display area DPA may have, but is not limited to, a rectangular shape similar to the general shape of the display device 10 when viewed from the top.

The display area DPA may include a plurality of pixels PX. The plurality of pixels PX may be arranged in a matrix. The shape of each of the pixels PX may be, but is not limited to, a rectangle or a square when viewed from the top. Each of the pixels PX may have a diamond shape having sides inclined with respect to a side of the display device 10. The plurality of pixels PX may include different color pixels PX. For example, the plurality of pixels PX may include, but is not limited to, a red first color pixel PX, a green second color pixel PX, and a blue third color pixel PX. The stripe-type pixels and PenTile™-type pixels may be arranged alternately, PENTILE™ being a registered trademark of Samsung Display Co., Ltd., Republic of Korea.

The non-display area NDA may be located around the display area DPA. The non-display area NDA may surround the display area DPA entirely or partially. The display area DPA may have a rectangular shape, and the non-display area NDA may be located to be adjacent to the four sides of the display area DPA. The non-display area NDA may form the bezel of the display device 10.

In the non-display areas NDA, a driver circuit or a driving element for driving the display area DPA may be located. According to one or more embodiments of the present disclosure, a pad area is located on the display substrate of the display device 10 in a first non-display area NDA1 located adjacent to a first longer side (the lower side in FIG. 1) of the display device 1, and a second non-display area NDA2 adjacent to a second longer side (the upper side in FIG. 1) of the display device 1. An external device EXD may be mounted on a pad electrode of the pad area. Examples of the external devices EXD may include a connection film, a printed circuit board, a driver chip DIC, a connector, a line connection film, etc. A scan driver SDR formed directly on the display substrate of the display device 10 may be located in the third non-display area NDA3 located adjacent to a first shorter side of the display device 1 (the left side in FIG. 1).

Figure 2:
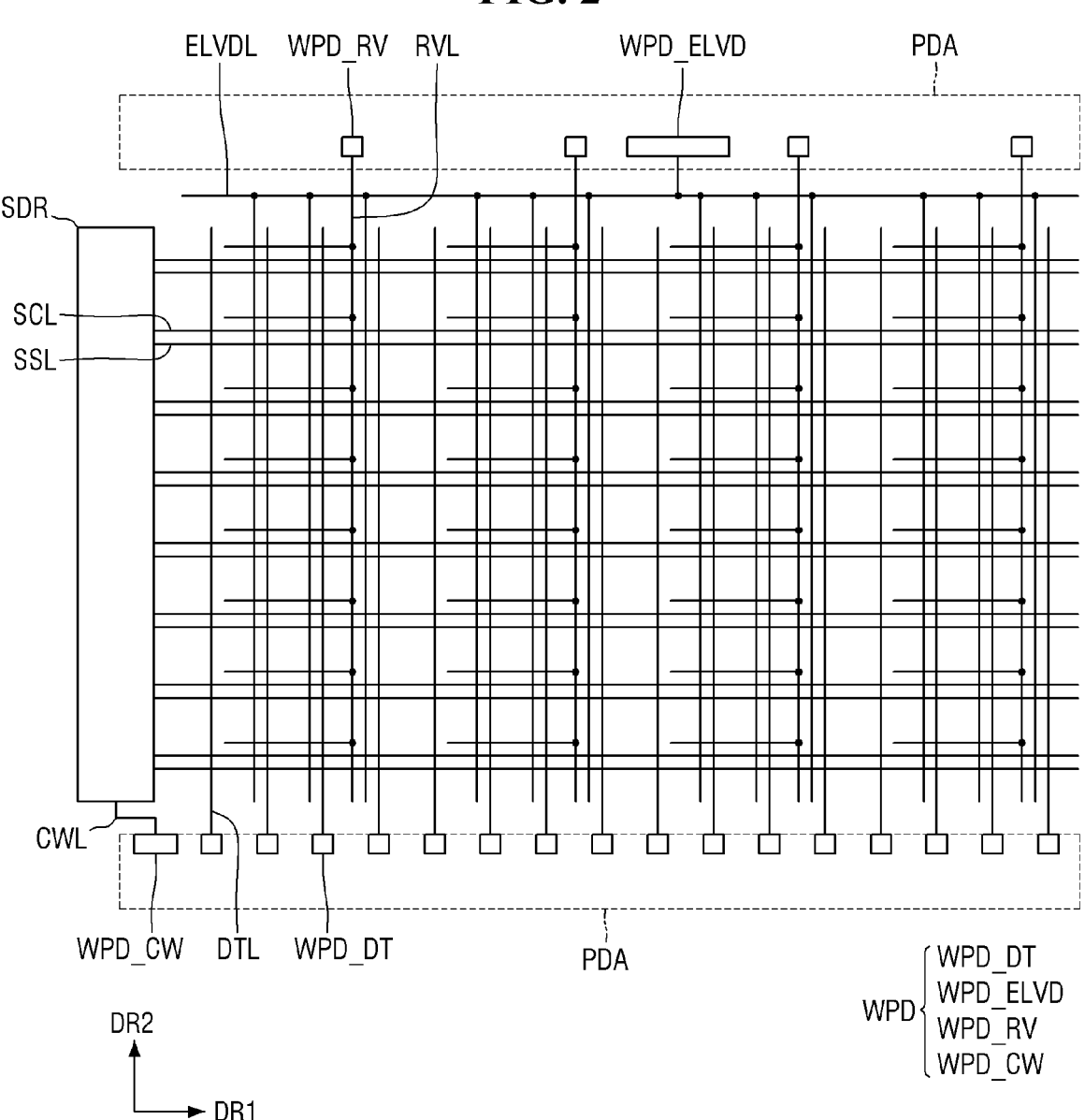
FIG. 2 is a view showing a layout of a circuit of a first substrate of a display device according to an embodiment.

FIG. 2 is a view showing a layout of a circuit of a first substrate of a display device according to one or more embodiments.

Referring to FIG. 2 in conjunction with FIG. 1, a plurality of lines is located on the first substrate. The plurality of lines may include a scan line SCL, a sensing signal line SSL, a data line DTL, a reference voltage line RVL, a first supply voltage line ELVDL, etc.

The scan line SCL and the sensing signal line SSL may extend in the first direction DR1. The scan line SCL and the sensing signal line SSL may be connected to the scan driver SDR. The scan driver SDR may include a driver circuit formed of the circuit layer CCL. The scan driver SDR may be located in the third non-display area NDA3 on the first substrate, but the present disclosure is not limited thereto. The scan driver SDR may be located in a fourth non-display area NDA4, or in both the third non-display area NDA3 and the fourth non-display area NDA4. The scan driver SDR may be connected to a signal connection line CWL. At least one end of the signal connection line CWL may form a pad WPD_CW on the first non-display area NDA1 and/or the second non-display area NDA2, and may be connected to an external device EXD (see FIG. 1).

The data line DTL and the reference voltage line RVL may extend in the second direction DR2 crossing the first direction DR1. A first supply voltage line ELVDL may include a portion extending in the second direction DR2. The first supply voltage line ELVDL may further include a portion extending in the first direction DR1. The first supply voltage line ELVDL may have, but is not limited to, a mesh structure.

The wire pads WPD may be respectively located at at least one end of the data line DTL, the reference voltage line RVL, and the first supply voltage line ELVDL. The wire pads WPD may be located in the pad area PDA of the non-display area NDA. According to one or more embodiments of the present disclosure, a wire pad WPD_DT of the data line DTL (hereinafter, referred to as a data pad) may be located in the pad area PDA of the first non-display area NDA1. A wire pad WPD_RV of the reference voltage line RVL (hereinafter referred to as a reference voltage pad) and a wire pad WPD_ELVD of the first supply voltage line ELVDL (hereinafter referred to as a first supply voltage pad) may be located in the pad area PDA of the second non-display area NDA2. As another example, the data pad WPD_DT, the reference voltage pad WPD_RV, and the first supply voltage pad WPD_ELVD may all be located in the same area (e.g., the first non-display area NDA1). As described above, the external devices EXD (see FIG. 1) may be mounted on the wire pad WPD. The external devices EXD may be mounted on the wire pads WPD by an anisotropic conductive film, ultrasonic bonding, etc.

Each of the pixels PX on the first substrate includes a pixel driver circuit. The above-described lines may pass through each of the pixels PX or the periphery thereof to apply a driving signal to the pixel driver circuit. The pixel driver circuit may include a transistor and a capacitor. The numbers of transistors and capacitors of each pixel driver circuit may be changed in a variety of ways. In the following description, the pixel driver circuit having a 3T1C structure including three transistors and one capacitor will be described as an example. It is, however, to be understood that the present disclosure is not limited thereto. A variety of modified pixel structure may be employed, such as a 2T1C structure, a 7T1C structure, and a 6T1C structure.

Figure 3:
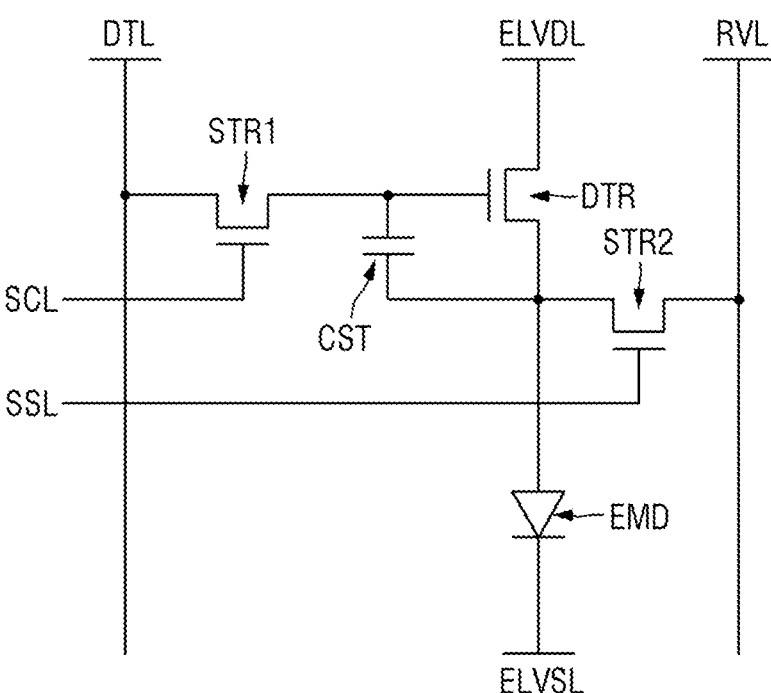
FIG. 3 is an equivalent circuit diagram of a pixel of a display device according to one or more embodiments of the present disclosure.

FIG. 3 is an equivalent circuit diagram of a pixel of a display device according to one or more embodiments of the present disclosure.

Referring to FIG. 3, each of the pixels PX of the display device according to one or more embodiments includes three transistors DTR, STR1, and STR2, and one storage capacitor CST, in addition to a light-emitting diode EMD.

The light-emitting diode EMD emits light in proportional to the current supplied through the driving transistor DTR. The light-emitting diode EMD may be implemented as an organic light-emitting diode, a micro light-emitting diode, a nano light-emitting diode, etc.

The first electrode (e.g., the anode electrode) of the light-emitting diode EMD may be connected to the source electrode of the driving transistor DTR, and the second electrode (e.g., the cathode electrode) thereof may be connected to a second supply voltage line ELVSL from which a low-level voltage (second supply voltage) is applied, and which is lower than a high-level voltage (first supply voltage) of a first supply voltage line ELVDL.

The driving transistor DTR adjusts a current flowing from the first supply voltage line ELVDL from which the first supply voltage is applied to the light-emitting diode EMD according to the voltage difference between the gate electrode and the source electrode. The gate electrode of the driving transistor DTR may be connected to a source/drain electrode of the first switching transistor STR1, the source electrode may be connected to a first electrode of the light-emitting diode EMD, and the drain electrode may be connected to the first supply voltage line ELVDL from which the first supply voltage is applied.

The first switching transistor STR1 is turned on by a scan signal of a scan line SCL to connect a data line DTL with the gate electrode of the driving transistor DTR. A gate electrode of the first switching transistor STR1 may be connected to the scan line SCL, the first source/drain electrode may be connected to the gate electrode of the driving transistor DTR1, and a second source/drain electrode thereof may be connected to the data line DTL.

The second switching transistor STR2 may be turned on by a sensing signal of a sensing signal line SSL to connect a reference voltage line RVL to the source electrode of the driving transistor DTR. A gate electrode of the second switching transistor ST2 may be connected to the sensing signal line SSL, the first source/drain electrode thereof may be connected to the reference voltage line RVL, and the second source/drain electrode thereof may be connected to the source electrode of the driving transistor DTR.

According to one or more embodiments of the present disclosure, the first source/drain electrode of each of the first and second switching transistors STR1 and STR2 may be a source electrode while the second source/drain electrode thereof may be a drain electrode. It is, however, to be understood that the present disclosure is not limited thereto. The first source/drain electrode of each of the first and second switching transistors STR1 and STR2 may be a drain electrode while the second source/drain electrode thereof may be a source electrode.

The capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second switching transistors STR1 and STR2 may be formed as thin-film transistors. In addition, although FIG. 3 shows that each of the driving transistor DTR and the first and second switching transistors STR1 and STR2 is implemented as an n-type MOSFET (metal oxide semiconductor field effect transistor), it is to be noted that the present disclosure is not limited thereto. That is to say, the driving transistor DTR and the first and second switching transistors STR1 and STR2 may be implemented as p-type MOSFETs, or one or more of them may be implemented as n-type MOSFETs while one or more others may be implemented as p-type MOSFETs.

Figure 4:
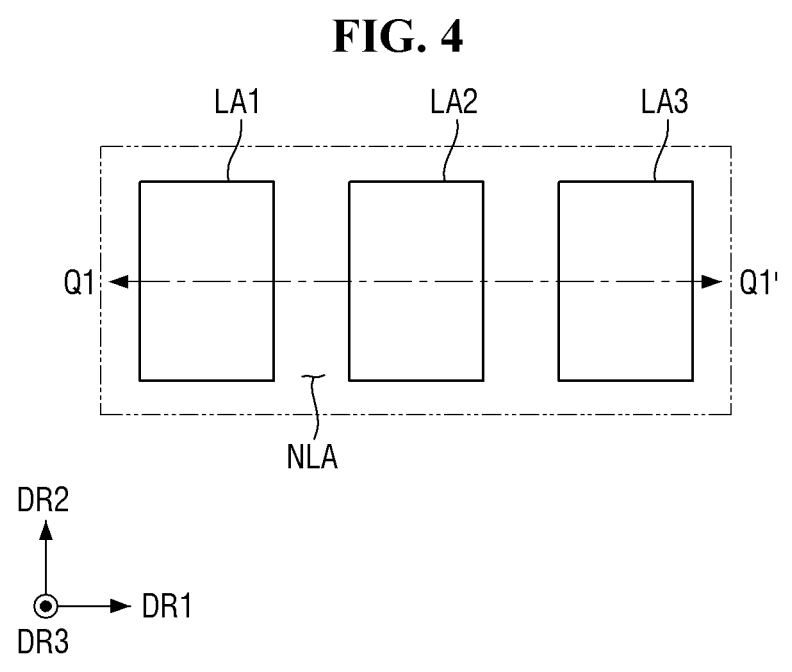
Figure 5:
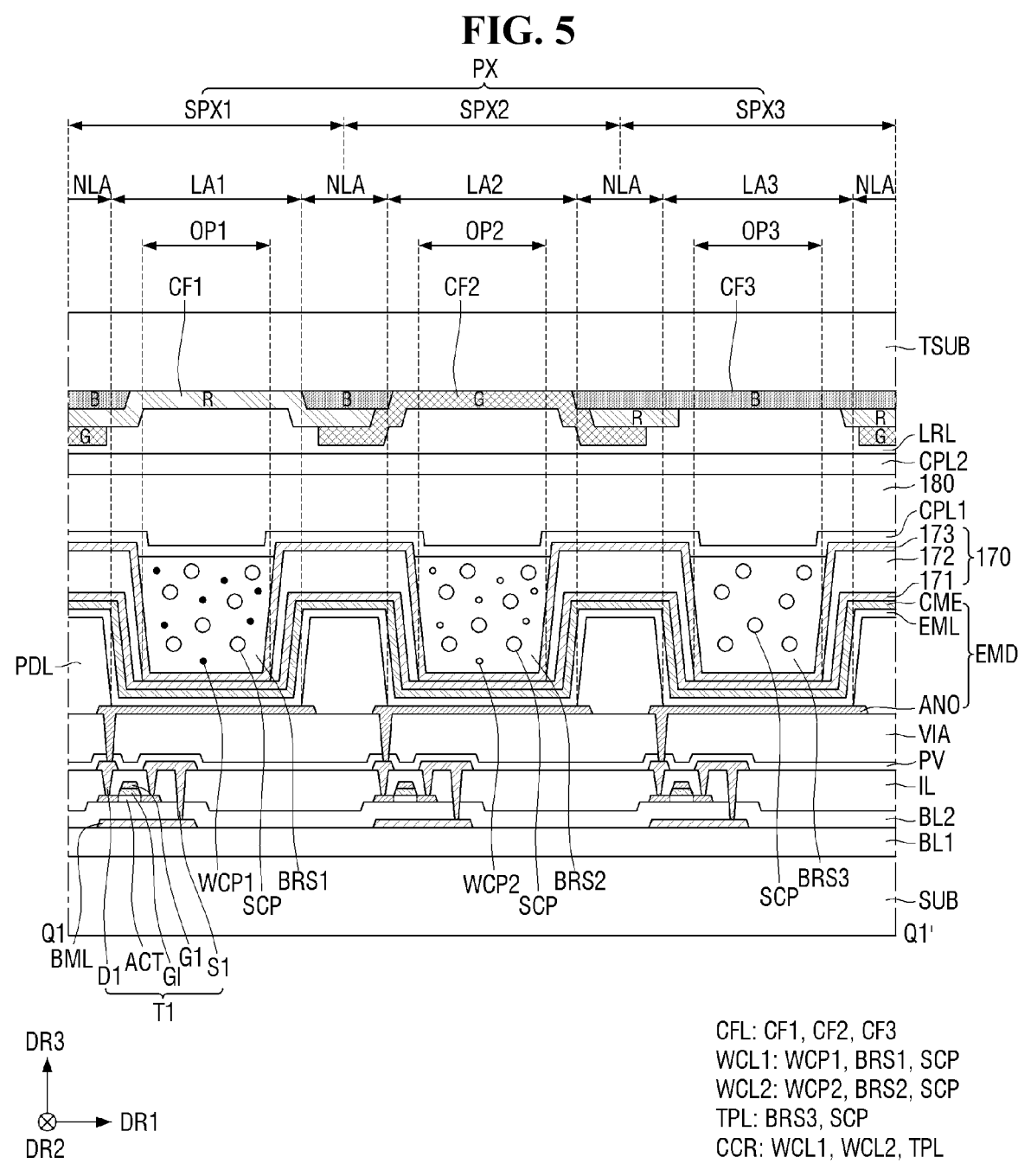
Figure 6:
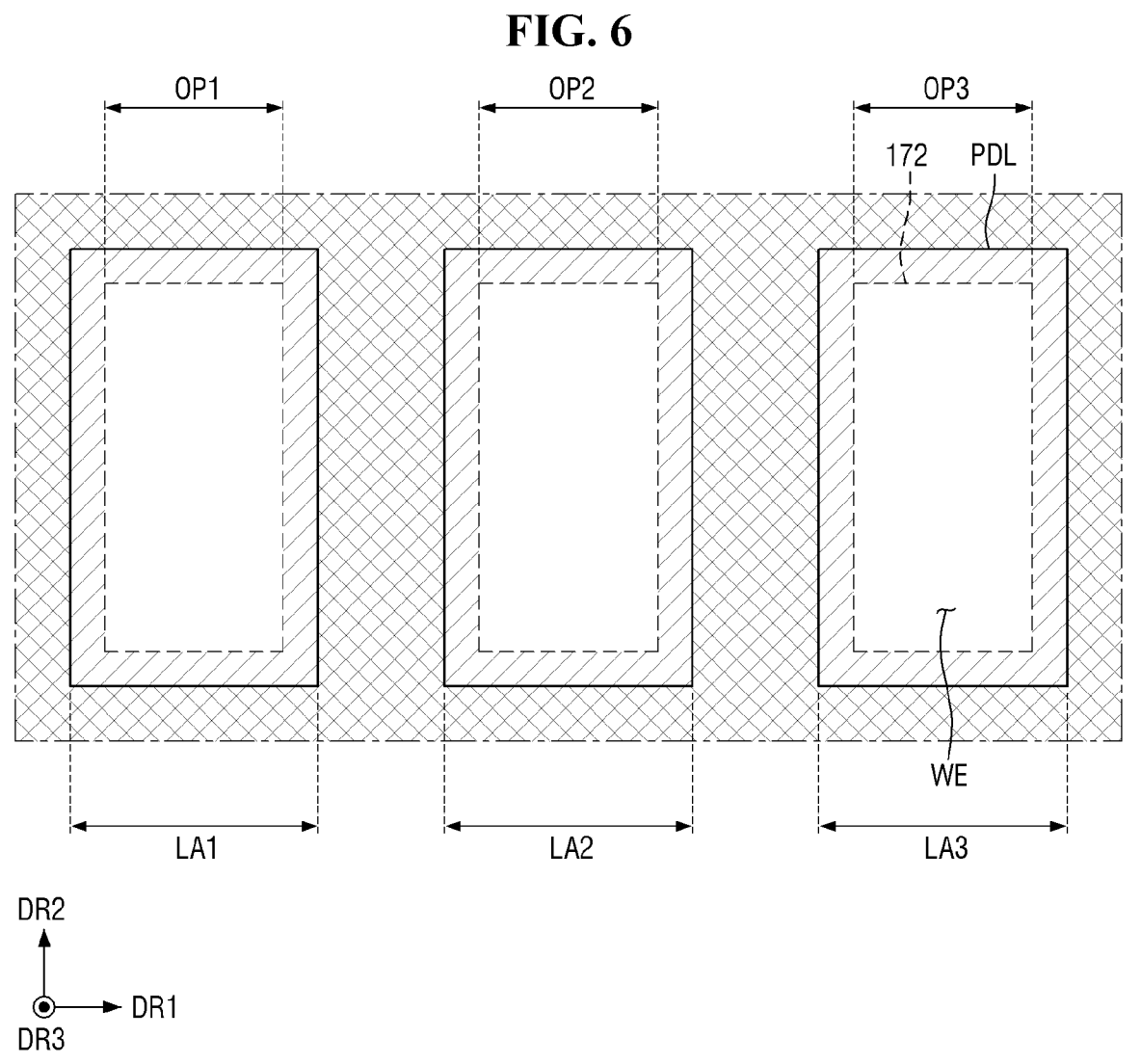

FIG. 4 is a plan view showing a pixel of a display device according to one or more embodiments of the present disclosure. FIG. 5 is a cross-sectional view taken along the line Q1-Q1' of FIG. 4. FIG. 6 is a plan view showing emission areas and openings of one pixel of a display device.

Referring to FIG. 4, a plurality of emission areas LA1, LA2, and LA3 and a non-emission area NLA may be defined on the substrate in the display area DPA. In some embodiments, a plurality of emission areas LA1, LA2, and LA3 in the display area DPA may include a first emission area LA1, a second emission area LA2, and a third emission area LA3. In the first, second and third emission areas LA1, LA2, and LA3, lights generated in the light-emitting elements of the substrate exit to the outside. In the non-emission area NLA, no lights exit therefrom to the outside.

In some embodiments, different lights may exit out of the first emission area LA1, the second emission area LA2, and the third emission area LA3. For example, the first light-emitting area LA1 may emit light of a first color, the second light-emitting area LA2 may emit light of a second color, and the third light-emitting area LA3 may emit light of a third color. The light of the first color may be blue light having a peak wavelength in the range of about 440 to about 480 nm. The light of the second color may be red light having a peak wavelength in the range of about 610 to about 650 nm. The light of the third color may be green light having a peak wavelength in the range of about 510 to about 550 nm. It should be understood, however, that the present disclosure is not limited thereto. The light of the second color may be green light and the light of the third color may be red light.

In some embodiments, the first emission area LA1, the second emission area LA2, and the third emission area LA3 may form a single group, and a plurality of such groups may be defined in the display area DPA.

In some embodiments, as shown in FIG. 4, the first emission area LA1, the second emission area LA2, and the third emission area LA3 may be arranged sequentially in a direction. In some embodiments, the first emission area LA1, the second emission area LA2, and the third emission area LA3 may form a single group, and such groups may be repeatedly arranged in the display area DPA.

It is, however, to be understood that the present disclosure is not limited thereto. The arrangement of the first emission area LA1, the second emission area LA2, and the third emission area LA3 may be altered in a variety of ways.

Referring to FIG. 5, the display device 10 may include a first substrate SUB, and a semiconductor layer, a plurality of conductive layers and a plurality of insulating layers located thereon. In addition, the display device 10 may include light-emitting diodes EMD each including a first electrode ANO, a light-emitting layer EML, and a second electrode CME. The semiconductor layer, the conductive layers, and the insulating layers may form a circuit layer of the display device 10.

The first substrate SUB may be an insulating substrate. The first substrate SUB may be made of an insulating material, such as glass, quartz, and a polymer resin. The first substrate SUB may be either a rigid substrate or a flexible substrate that can be bent, folded, or rolled.

A first buffer layer BL1 may be located on the first substrate SUB. The first buffer layer BL1 may be formed on the first substrate SUB to protect the thin-film transistors from moisture permeating through the first substrate SUB that is susceptible to moisture permeation, and may also provide a flat surface.

A first conductive layer may be located on the first buffer layer BL1. The first conductive layer includes a bottom metal layer BML. The bottom metal layer BML is located to overlap an active layer ACT of a first transistor T1. The bottom metal layer BML may reduce or prevent light incident on the active layer ACT of the first transistor or may be electrically connected to the active layer ACT to stabilize the electrical characteristics of the first transistor T1. It is to be noted that the bottom metal layer BML may be eliminated.

A second buffer layer BL2 may be located on the bottom metal layer BML. The second buffer layer BL2 may cover the bottom metal layer BML, may protect the first transistor T1 from moisture penetrating from the outside, and may provide a flat surface.

A semiconductor layer may be located on the second buffer layer BL2. The semiconductor layer may include the active layer ACT of the first transistor T1. The active layer ACT may be located to partially overlap with a gate electrode G1 of a second conductive layer, which will be described later.

The semiconductor layer may include polycrystalline silicon, monocrystalline silicon, an oxide semiconductor, etc. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although the first transistor T1 is located in the sub-pixel SPXn of the display device 10 in the drawing, the present disclosure is not limited thereto. A larger number of transistors may be included in the display device 10.

The gate-insulating layer GI may be located on the semiconductor layer. The gate-insulating layer GI may work as a gate insulating film of the first transistor T1. In the example shown in the drawings, the gate-insulating layer GI is patterned together with the gate electrode G1 of the second conductive layer to be described later, and is partially located between the second conductive layer and the active layer ACT of the semiconductor layer. It should be understood, however, that the present disclosure is not limited thereto. In some embodiments, the gate-insulating layer GI may be located entirely on the semiconductor layer and the second buffer layer BL2.

The second conductive layer may be located on the gate-insulating layer GI. The second conductive layer may include a gate electrode G1 of the first transistor T1. The gate electrode G1 may be located so that it overlaps a channel region of the active layer ACT in the thickness direction (e.g., a third direction DR3). In one or more embodiments, the second conductive layer may further include an electrode of a storage capacitor.

An interlayer dielectric layer IL may be located on the second conductive layer. The interlayer dielectric film IL may work as an insulating film between the second conductive layer and other layers located thereon, and can protect the second conductive layer.

A third conductive layer may be located on the interlayer dielectric layer IL. The third conductive layer may include a source electrode S1 and a drain electrode D1 of the first transistor T1. In one or more embodiments, the third conductive layer may further include the other electrode of the storage capacitor.

The source electrode S1 and the drain electrode D1 may be in contact with the active layer ACT of the first transistor T1 through respective contact holes penetrating through the interlayer dielectric layer IL and the gate-insulating layer GI. In addition, the source electrode S1 may be in contact with the bottom metal layer BML through a contact hole penetrating through the interlayer dielectric layer IL, the gate-insulating layer GI and the buffer layer BL. The first transistor T1 may be the driving transistor described above with reference to FIG. 3.

A passivation layer PV is located on the third conductive layer. The passivation layer PV may work as an insulating film between the third conductive layer and other layers and can protect the third conductive layer.

The first buffer layer BL1, the second buffer layer BL2, the gate-insulating layer GI, the interlayer dielectric layer IL, and the passivation layer PV may be made up of multiple inorganic layers stacked on one another alternately. For example, the first buffer layer BL1, the second buffer layer BL2, the gate-insulating layer GI, the interlayer dielectric layer IL, and the passivation layer PV may be made up of a double layer in which inorganic layers including at least one of silicon oxide (SiOx), silicon nitride (SiNx), and/or silicon oxynitride (SiON) are stacked on one another or multiple layers in which they are alternately stacked on one another. It is, however, to be understood that the present disclosure is not limited thereto. The first buffer layer BL1, the second buffer layer BL2, the gate-insulating layer GI, the interlayer dielectric layer IL, and the passivation layer PV may be made up of a single inorganic layer including the above-described insulating material. In addition, in some embodiments, the interlayer dielectric film IL may be made of an organic insulating material, such as polyimide (PI).

A via layer VIA may be located on the passivation layer PV. The via layer VIA may include an organic insulating material, such as polyimide (PI), to provide a flat surface over the underlying conductive layers having different heights. It should be noted that the via layer VIA may be eliminated in some implementations.

The display device 10 may include light-emitting diodes EMD each including the first electrode ANO, the light-emitting layer EML, and the second electrode CME as a display element layer located on the via layer VIA. In addition, the display device 10 may include a pixel-defining film PDL located on the via layer VIA.

The first electrode ANO may be located on the via layer VIA. The first electrode ANO may be located in each sub-pixel SPX1, SPX2, and SPX3. The first electrode ANO may be located separately between adjacent sub-pixels SPX1, SPX2, and SPX3.

The first electrode ANO may be an anode electrode of the light-emitting diode EMD. The first electrode ANO may have a stack structure of a material layer having a high work function, such as indium-tin-oxide (ITO), indium-zinc-oxide (IZO), zinc oxide (ZnO), and indium oxide ($In_2O_3$), and a reflective material layer, such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof. A material layer having a higher work function may be located on a higher layer than a reflective material layer so that it may be closer to the light-emitting layer EML. The first electrode ANO may have, but is not limited to, a multilayer structure of ITO/Mg, ITO/MgF, ITO/Ag, and ITO/Ag/ITO.

The pixel-defining film PDL may be located on the via layer VIA along the borders of the sub-pixels SPX1, SPX2, and SPX3. The pixel-defining film PDL may be located on the first electrode ANO, and may include an opening exposing the first electrode ANO. The emission areas LA1, LA2, and LA3 and the non-emission area NEM can be distinguished by the pixel-defining film PDL and the openings.

The pixel-defining film PDL may include an organic insulating material, such as polyacrylate resin, epoxy resin, phenolic resin, polyamide resin, polyimide resin, unsaturated polyesters resin, poly phenylene ether resin, polyphenylene sulfide resin, and benzocyclobutene (BCB). The pixel-defining film PDL may include an inorganic material.

The light-emitting layer EML may be located on the pixel-defining film PDL and the first electrode ANO. According to one or more embodiments of the present disclosure, the light-emitting layer EML may include an organic layer containing an organic material. The organic layer includes an organic emissive layer, and may further include hole injection/transport layers and/or electron injection/transport layers as auxiliary layers in some implementations to facilitate emission. In one or more other embodiments where the display device is a micro LED display device, a nano LED display device, etc., the light-emitting layer EML may include an inorganic material, such as an inorganic semiconductor. According to one or more embodiments of the present disclosure, the light-emitting layer EML may be located over the display area DPA of the first substrate SUB. It is, however, to be understood that the present disclosure is not limited thereto. The light-emitting layer EML may be located separately between the sub-pixels SPX1, SPX2, and SPX3.

According to one or more embodiments of the present disclosure, the pixel-defining film PDL may have a height (e.g., a predetermined height) to provide a space in which a color control layer CCR, which will be described later, is formed. The height of the pixel-defining film PDL may be in the range of about 1 μm to about 10 μm. According to one or more embodiments of the present disclosure, the height of the pixel-defining film PDL may be in the range of about 4 μm to about 5 μm. The pixel-defining film PDL with a relatively large height is formed before the light-emitting layer EML is formed, and thus it is possible to reduce or prevent damage to the light-emitting layer EML by a high-temperature heat treatment process.

The light-emitting layer EML may emit light of the same color in different sub-pixels SPX1, SPX2, and SPX3. For example, the light-emitting layer EML may emit blue light in the sub-pixels SPX1, SPX2, and SPX3. Blue light emitted from the light-emitting layer EML may be converted into red light and green light in the wavelength conversion layer WCL located in the first sub-pixel SPX1 and the second sub-pixel SPX2, respectively, while the blue light may pass through the transparent layer TPL in the third sub-pixel SPX3 as it is. Red, green, and blue light may pass through the color filter layers CFL, respectively. A common electrode CME may be located on the light-emitting layer EML. The common electrode CME may be in contact with the light-emitting layer EML. The common electrode CME may extend across different the sub-pixels SPX1, SPX2, and SPX3. The common electrode CME may be a cathode electrode of the light-emitting diode EMD.

The common electrode CME may include a material layer having a small work function, such as Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The common electrode CME may further include a transparent metal oxide layer located on the material layer having a small work function.

The display device 10 may include a thin-film encapsulation structure 170 located on the light-emitting diodes EMD, and a color control layer CCR located on the thin-film encapsulation structure 170.

The thin-film encapsulation structure 170 may be located on the common electrode CME of the light-emitting diodes EMD. The thin-film encapsulation structure 170 may include at least one thin-film encapsulation layer. For example, the thin-film encapsulation layer may include a first inorganic film 171, an organic film 172, and a second inorganic film 173. Each of the first inorganic film 171 and the second inorganic film 173 may include silicon nitride, silicon oxide, silicon oxynitride, or the like.

The organic film 172 may include an organic insulating material, such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

As shown in FIGS. 5 and 6, the organic film 172 is located entirely in the display area DPA, and may be located in a grid shape when viewed from the top. The organic film 172 may include a plurality of openings OP1, OP2, and OP3. The openings OP1, OP2, and OP3 may be arranged such that they overlap the emission areas LA1, LA2, and LA3, respectively. The plurality of openings OP1, OP2, and OP3 may include a first opening OP1, a second opening OP2, and a third opening OP3. The first opening OP1 may be located in the first sub-pixel SPX1 and may overlap with the first emission area LA1. The second opening OP2 may be located in the second sub-pixel SPX2 and may overlap with the second emission area LA2. The third opening OP3 may be located in the third sub-pixel SPX3 and may overlap with the third emission area LA3.

The organic film 172 may be located to cover the pixel-defining film PDL that partitions the emission areas LA1, LA2, and LA3, and may be located to cover the side surfaces of the pixel-defining film PDL. Each of the openings OP1, OP2, and OP3 may expose the upper surface of the first inorganic film 171 located thereunder. Accordingly, each of the openings OP1, OP2, and OP3 may form a well space WE having a depth from the upper surface of the portion of the organic film 172 on the pixel-defining film PDL to the upper surface of the portion of the first inorganic film 171 exposed in the emission areas LA1, LA2, and LA3. A color control layer CCR, which will be described later, may be located in the well space WE formed by each of the openings OP1, OP2, and OP3 of the organic film 172.

According to one or more embodiments of the present disclosure, by increasing the height of the pixel-defining film PDL and forming the openings OP1, OP2, and OP3 in the organic film 172, it is possible to provide the well space WE where the color control layer CCR is applied. If an organic material having a relatively high height suitably using high-temperature heat treatment is formed in a process subsequent to the light-emitting layer EML, the light-emitting layer EML may be deteriorated by the high temperature. In addition, if the organic material is cured at a low temperature, the organic material may fail to be completely cured, and thus outgassing may be derived from the organic material. By using the pixel-defining film PDL and the organic film 172 to provide the well space WE where the color control layer CCR is applied, it is possible to reduce or prevent deterioration of the light-emitting layer EML and outgassing of the organic material.

According to one or more embodiments of the present disclosure, the organic film 172 may include a black pigment. If the organic film 172 includes a black pigment, it is possible to reduce or prevent the likelihood that the lights with converted wavelengths in the color control layer CCR, which will be described later, travel to the adjacent sub-pixels SPX1, SPX2, and SPX3 and are mixed with one another.

The second inorganic film 173 may be located on the organic film 172 and the first inorganic film 171. The second inorganic film 173 may be located to cover the organic film 172 and the first inorganic film 171, and may be in direct contact with the upper surface of the first inorganic film 171 exposed by the openings OP1, OP2, and OP3 of the organic film 172. As the second inorganic film 173 and the first inorganic film 171 come into contact with each other in each of the emission areas LA1, LA2, and LA3, it is possible to extend the path of moisture permeating through the organic film 172, thereby suppressing the deterioration of the light-emitting layer EML.

The color control layer CCR may be located on the thin-film encapsulation structure 170. The color control layer CCR may be located in the well space WE formed by the pixel-defining film PDL and the thin-film encapsulation structure 170. The color control layer CCR may be located in each of the openings OP1, OP2, and OP3 surrounded by the organic film 172 to form an island-shaped pattern in the display area DPA. It should be understood, however, that the present disclosure is not limited thereto. The color control layer CCR may extend in a direction and may be located across the sub-pixels SPX1, SPX2, and SPX3 to form a linear pattern.

In one or more embodiments where the light-emitting diodes EMD of each of the sub-pixels SPX1, SPX2, and SPX3 emit blue light, the color control layer CCR may include a first wavelength conversion layer WCL1 located in the first sub-pixel SPX1 in line with the first light-transmitting area LA1, a second wavelength conversion layer WCL2 located in the second sub-pixel SPX2 in line with the second light-transmitting area LA2, and a transparent layer TPL located in the third sub-pixel SPX3 in line with the third light-transmitting area LA3.

The first wavelength conversion layer WCL1 may include a first base resin BRS1, and first wavelength-converting particles WCP1 dispersed in the first base resin BRS1. The second wavelength conversion layer WCL2 may include a second base resin BRS2, and second wavelength-converting particles WCP2 dispersed in the second base resin BRS2. The first wavelength conversion layer WCL1 and the second wavelength conversion layer WCL2 convert and transmit the wavelength of the blue light incident from the light-emitting diodes EMD. The first wavelength conversion layer WCL1 and the second wavelength conversion layer WCL2 may further include scattering particles SCP included in each base resin, and the scattering particles SCP can increase wavelength conversion efficiency.

The transparent layer TPL may include a base resin BRS3, and scattering particles SCP dispersed in the third base resin BSR3. The transparent layer TPL transmits the wavelength of the blue light incident from the light-emitting diodes ED as it is. The scattering particles SCP of the transparent layer TPL may adjust a path of exiting light through the transparent layer TPL. The transparent layer TPL may include no wavelength-converting material.

The scattering particles SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc.

The first to third base resins BRS1, BRS2, and BRS3 may include a transparent organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be made of, but is not limited to, the same material.

The first wavelength-converting material WCP1 may be a material that converts blue light into red light, and the second wavelength-converting material WCP2 may be a material that converts blue light into green light. The first wavelength-converting particles WCP1 and the second wavelength-converting particles WCP2 may be quantum dots, quantum rods, phosphors, etc. The quantum dots may include IV nanocrystals, II-VI compound nanocrystals, III-V compound nanocrystals, IV-VI nanocrystals, or combinations thereof.

In some embodiments, the color control layer CCR may be formed via an inkjet printing process or a photoresist process. The color control layer CCR may be formed via drying or exposure and development processes after a material forming it is sprayed or applied in the openings OP1, OP2, and OP3.

While the light-emitting diodes EMD of different sub-pixels SPX1, SPX2, and SPX3 may emit light of the same color (e.g., the blue light), the lights of different colors may exit from the different sub-pixels SPX1, SPX2, and SPX3. For example, the light emitted from the light-emitting diodes EMD located in the first sub-pixel SPX1 is incident on the first wavelength conversion layer WCL1, the light emitted from the light-emitting diodes EMD located in the second sub-pixel SPX2 is incident on the second wavelength conversion layer WCL1, the light emitted from the light-emitting diodes EMD located in the second sub-pixel SPX2 is incident on the second wavelength conversion layer WCL2, and the light emitted from the light-emitting diodes EMD located in the third sub-pixel SPX3 is incident on the transparent layer TPL.

The blue light incident on the first wavelength conversion layer WCL1 may be converted into red light, the blue light incident on the second wavelength conversion layer WCL2 may be converted into green light, and the blue light incident on the transparent layer TPL may pass through it as the same blue light without wavelength conversion. Although the sub-pixels SPX1, SPX2, and SPX3 include the light-emitting diodes EMD that emit light of the same color, lights of different colors can be output by placing the color control layer CCR over them.

In addition, the display device 10 may include a first capping layer CPL1 located on the color control layer CCR. The first capping layer CPL1 can reduce or prevent impurities, such as moisture and air, permeating from the outside to damage or contaminate the color control layer CCR.

The first capping layer CPL1 may be in direct contact with upper surfaces of the first wavelength conversion layer WCL1, the second wavelength conversion layer WCL2, and the transparent layer TPL of the color control layer CCR. The first capping layer CPL1 may be made of an inorganic material. For example, the first capping layer CPL1 may be made of a material including silicon nitride, aluminum nitride, zirconium nitride, titanium nitride, hafnium nitride, tantalum nitride, silicon oxide, aluminum oxide, titanium oxide, tin oxide, silicon oxynitride, etc.

The display device 10 may include a second substrate TSUB facing the first substrate SUB, and a color filter layer CFL located on the second substrate TSUB.

The second substrate TSUB may be located above the first substrate SUB to face it. The second substrate TSUB may include a transparent material. The second substrate TSUB may include a transparent insulating material, such as glass and quartz. The second substrate TSUB may be a rigid substrate. However, the second substrate TSUB is not limited to those described above. The second substrate TSUB may include a plastic, such as polyimide or may be flexible so that it is curved, bent, folded, or rolled.

The second substrate TSUB may be of the same type as the first substrate SUB or may have different material, thickness, transmittance, etc. For example, the second substrate TSUB may have a higher transmittance than the first substrate SUB. The second substrate TSUB may be either thicker than, thinner than, or the same thickness as the first substrate SUB.

A color filter layer CFL may be located on one surface of the second substrate TSUB. The color filter layer CFL may include a colorant, such as a dye and a pigment that absorb wavelengths other than the wavelength of a corresponding color. The color filter layer CFL can block the emission of lights of colors other than the respective corresponding color of each of the sub-pixels SPX1, SPX2, and SPX3. In other words, the color filter layer CFL may selectively transmit light of the corresponding color.

The color filter layer CFL may include a first color filter CF1, a second color filter CF2, and a third color filter CF3. The first color filter CF1 may be a red color filter, the second color filter CF2 may be a green color filter, and the third color filter CF3 may be a blue color filter. That is to say, the first color filter CF1 may selectively transmit red light, the second color filter CF2 may selectively transmit green light, and the third color filter CF3 may selectively transmit blue light.

The first color filter CF1 may be located in the first sub-pixel SPX1, the second color filter CF2 may be located in the second sub-pixel SPX2, and the third color filter CF3 may be located in the third sub-pixel SPX3. For example, the first color filter CF1 may be located in and overlap with the first emission area LA1, the second color filter CF2 may be located in and overlap with the second emission area LA2, and the third color filter CF3 may be located in and overlap with the third emission area LA3. In addition, the third color filter CF3 may be located in the non-emission area NLA of one pixel PX, and at least one of the first color filter CF1 and/or the second color filter CF2 may be further located such that it is overlaps therewith. That is to say, the first color filter CF1, the second color filter CF2, and the third color filter CF3 may be located in the non-emission area NLA.

Accordingly, it is possible to block the light from exiting from the non-emission area NLA, and to suppress the reflection of external light. The color filters CF1, CF2, and CF3 may block lights of other colors than the corresponding colors of the sub-pixels SPX1, SPX2, and SPX3, and thus red, green and blue lights can be blocked in the non-emission area NLA. It should be understood, however, that the present disclosure is not limited thereto. A light-absorbing member including a light-absorbing material that absorbs a visible wavelength band may be located in the non-emission area NLA.

A low-refractive layer LRL may be located on the color filter layer CFL. The low-refractive layer LRL may be located across the emission areas LA1, LA2, and LA3 and the non-emission area NLA. The low-refractive layer LRL may have a low refractive index. For example, the low-refractive layer LRL may have a refractive index of about 1.1 to about 1.4.

The low-refractive layer LRL may reflect some of the lights traveling from the lower side toward the second substrate TSUB back to the first substrate SUB on the lower side. That is to say, the low-refractive layer LRL may recycle at least some of the lights traveling toward the second substrate TSUB, thereby improving the light emission efficiency. As a result, the luminous efficiency of the display device 10 can be improved. The low-refractive layer LRL includes an organic material and may include particles dispersed therein. The particles may include, for example, hollow silica particles.

A second capping layer CPL2 may be located on the low-refractive layer LRL. The second capping CPL2 can reduce or prevent impurities, such as moisture and air, permeating from the outside to damage or contaminate the color filter layer CFL and the low-refractive layer LRL. In addition, the second capping layer CPL2 can reduce or prevent the colorant of the color filter layer CFL being diffused into other elements.

The second capping layer CPL2 may be in direct contact with the surface (the surface facing the first substrate SUB) of the low-refractive layer LRL. The second capping layer CPL2 may be made of an inorganic material. For example, the second capping layer CPL2 may be made of a material including silicon nitride, aluminum nitride, zirconium nitride, titanium nitride, hafnium nitride, tantalum nitride, silicon oxide, aluminum oxide, titanium oxide, tin oxide, silicon oxynitride, etc.

The display device 10 may be implemented by bonding the first substrate SUB with the second substrate TSUB. The display device 10 may include a filling layer 180 located between the first capping layer CPL1 and the second capping layer CPL2. The filling layer 180 may be used to fill the space between the first substrate SUB and the second substrate TSUB. That is to say, the space between the first substrate SUB and the second substrate TSUB may be filled with the filling layer 180, and they may be coupled with each other by the filling layer 50.

The filling layer 180 may be made of a material that transmits light. The filling layer 180 may include an organic material. For example, the filling layer 180 may be made of, but is not limited to, a silicon-based organic material, an epoxy-based organic material, etc. The filling layer 180 may be eliminated.

As described above, in the display device 10 according to one or more embodiments of the present disclosure, by using the pixel-defining film PDL and the organic film 172 to provide the well space WE where the color control layer CCR is applied, it is possible to reduce or prevent deterioration of the light-emitting layer EML and outgassing of the organic material.

FIGS. 7 to 12 are cross-sectional views showing processing steps of fabricating a display device according to one or more embodiments of the present disclosure.

FIGS. 7 to 12 are cross-sectional views showing the structure of the layers of a pixel PX of a display device 10 in the order that they are formed, which may be associated with the cross-sectional view of FIG. 5. A process of forming each of the layers may be performed by a typical patterning process and inkjet printing. In the following description, the formation order will be mainly described in each of the processes rather than the formation method.

Figure 7:
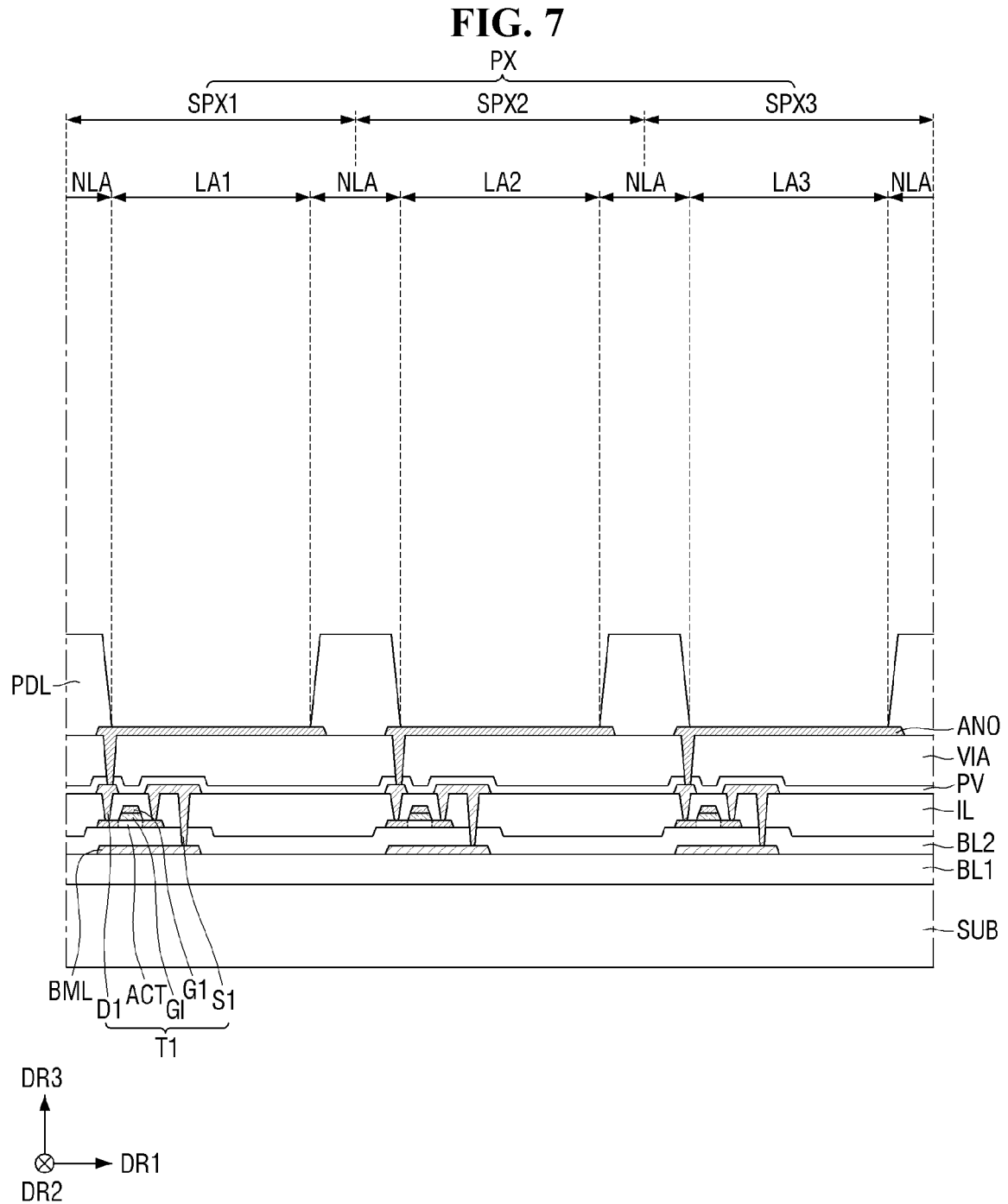

Initially, referring to FIG. 7, a first substrate SUB is prepared, and a circuit layer is formed on the first substrate SUB. The circuit layer forms first to third conductive layers, first and second buffer layers, a gate-insulating layer, and an interlayer dielectric layer.

For example, a first buffer layer BL1 is formed on the first substrate SUB, and a bottom metal layer BML and a second buffer layer BL2 located thereon are formed. The bottom metal layer BML may be formed via a mask process. For example, a material layer for a first conductive layer is deposited entirely on the first substrate SUB, and then it may be patterned via a photolithography process, so that the bottom metal layer BML may be formed. The first buffer layer BL1 and the second buffer layer BL2 may be formed by depositing a material layer for a buffer layer entirely on the first substrate SUB.

Subsequently, a semiconductor layer is formed on the second buffer layer BL2. The semiconductor layer may include the active layer ACT of the first transistor T1, which may be formed via a mask process. For example, an oxide semiconductor may be deposited entirely on the second buffer layer BL2, and then may be patterned via a photolithography process, to form the active layer ACT. Each of the layers may be formed via a process similar to the above-described process, and thus the redundant descriptions or detailed description thereof will be omitted, and a process sequence will be described in detail.

Subsequently, a gate-insulating layer GI is formed on the second buffer layer BL2 where an active layer ACT is formed, and a gate electrode G1 is formed thereon. The gate-insulating layer GI may be formed by depositing a material layer for the gate-insulating layer entirely on the first substrate SUB, and the gate electrode G1 may be formed by stacking a material layer for the second metal layer and performing a mask process.

Subsequently, an interlayer dielectric layer IL is formed over the gate electrode G1 formed on the first substrate SUB, and contact holes are formed to expose a portion of the bottom metal layer BML and the active layer. The interlayer dielectric layer IL may be formed by depositing a material layer for an interlayer dielectric layer entirely, and the contact holes may be formed via a mask process.

Subsequently, a source electrode S1 and a drain electrode D1 are formed on the interlayer dielectric layer IL in which contact holes are formed. The source electrode S1 and the drain electrode D1 may be formed by stacking a material layer for the third conductive layer on the interlayer dielectric layer IL and performing a mask process. The drain electrode D1 may be deposited to the inside of the contact hole formed in the interlayer dielectric layer IL to be connected to the bottom metal layer BML and the active layer ACT.

Subsequently, a passivation layer PV is formed over the source electrode S1 and the drain electrode D1 formed on the interlayer dielectric layer IL, and a via layer VIA is formed thereon. The passivation layer PV may be formed by entirely depositing a material layer for the passivation layer. The via layer VIA may include an organic material including a photosensitive material, and these may be formed through exposure and development after applying the organic material layer. A contact hole exposing the source electrode S1 may be formed in the via layer VIA.

Subsequently, a first electrode ANO is formed on the via layer VIA. The first electrode ANO may be formed by stacking a material layer for the first electrode, and by performing a mask process. The first electrode ANO may be deposited to the inside of the contact hole formed in the via layer VIA to be connected to the source electrode S1.

Subsequently, a pixel-defining film PDL is formed on the via layer VIA on which the first electrode ANO is formed. The pixel-defining film PDL may include an organic material. These may be formed by applying an organic material layer and then by performing a mask process. The pixel-defining film PDL may have a height of about 1 μm to about 10 μm. The pixel-defining film PDL may partition the emission areas LA1, LA2, and LA3 of the sub-pixels SPX1, SPX2, and SPX3.

Figure 8:
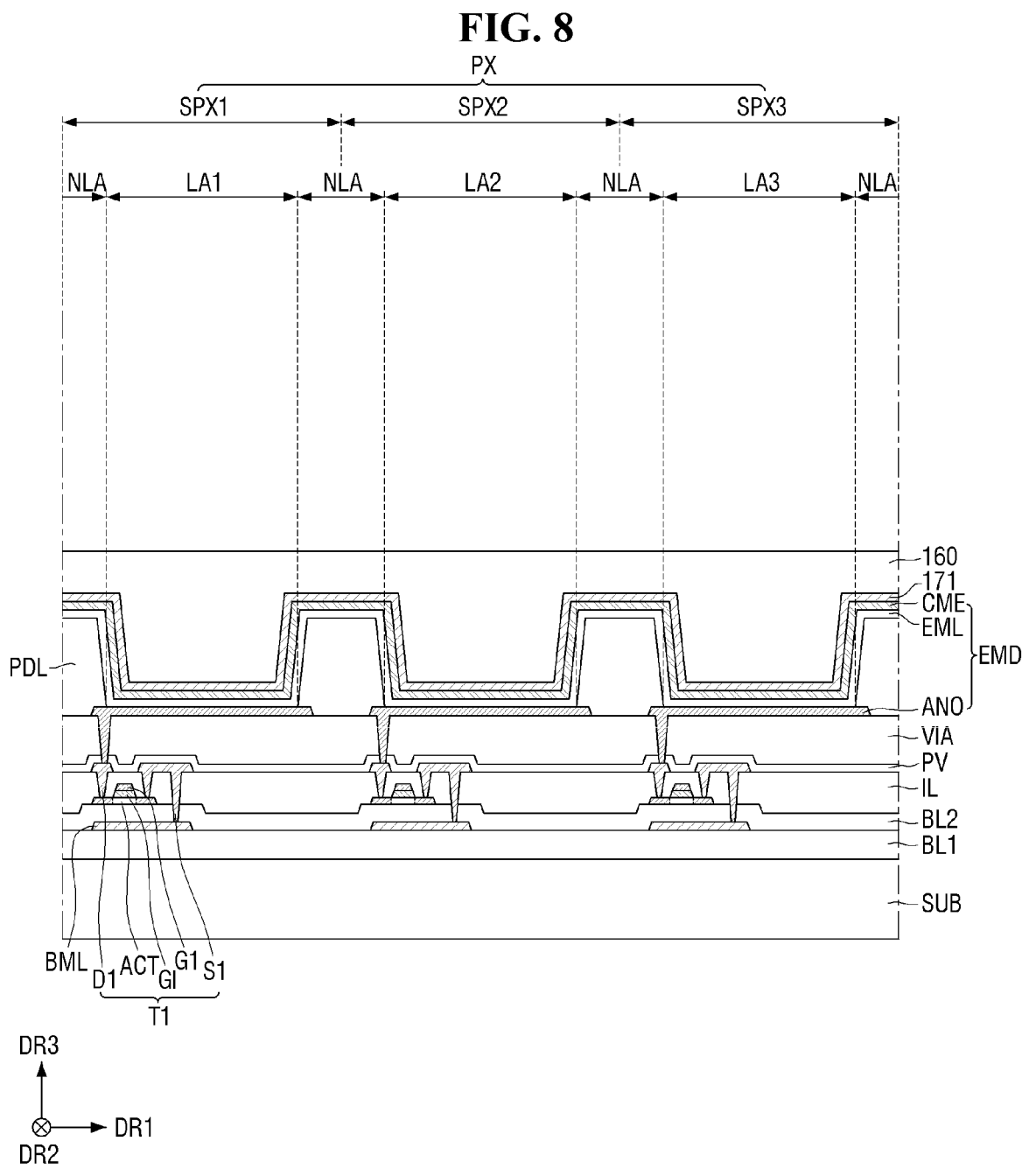

Subsequently, referring to FIG. 8, a light-emitting layer EML and a second electrode CME are formed on the pixel-defining film PDL formed on the first substrate SUB. The light-emitting layer EML may be formed using an inkjet printing process or a mask. The light-emitting layer EML is formed on the first electrode ANO and the pixel-defining film PDL, and may be continuously formed across adjacent sub-pixels SPX1, SPX2, and SPX3. The second electrode CME is formed on the light-emitting layer EML, and may be continuously formed across adjacent sub-pixels SPX1, SPX2, and SPX3. In this manner, the light-emitting diode EMD including the first electrode ANO, the light-emitting layer EML, and the second electrode CME may be formed.

Subsequently, a first inorganic film 171 is formed on the light-emitting diode EMD, and an organic material layer 160 is formed thereon. The first inorganic film 171 may be formed entirely on the second electrode CME of the light-emitting diode EMD. The first inorganic film 171 may be formed by entirely depositing a material layer for the first inorganic film. The organic material layer 160 may be formed by applying an organic insulating material using a solution process, such as an inkjet printing process. The organic insulating material may be a transparent material capable of transmitting light.

Subsequently, referring to FIG. 9, an organic film 172 is formed by forming openings OP1, OP2, and OP3 in the organic material layer 160 using a photolithography process. For example, the openings OP1, OP2, and OP3 exposing the first inorganic film 171 are formed by removing parts of the organic material layer 160 which overlap the emission areas LA1, LA2, and LA3. A first opening OP1 of the organic film 172 may overlap the first emission area LA1, a second opening OP2 of the organic film 172 may overlap the second emission area LA2, and a third opening OP3 of the organic film 172 may overlap the third emission area LA3. It should be understood, however, that the present disclosure is not limited thereto. According to one or more other embodiments the process of forming the openings OP1, OP2, and OP3 in the organic material layer 160 may be formed using a laser or drilling.

According to one or more embodiments of the present disclosure, each of the openings OP1, OP2, and OP3 may be form a well space WE having a depth from the upper surface of the portion of the organic film 172 on the pixel-defining film PDL to the upper surface of the portion of the first inorganic film 171 exposed in the emission areas LA1, LA2, and LA3. A color control layer CCR, which will be described later, may be formed in the well space WE formed by each of the openings OP1, OP2, and OP3 of the organic film 172.

According to one or more embodiments of the present disclosure, by increasing the height of the pixel-defining film PDL and forming the openings OP1, OP2, and OP3 in the organic film 172, it is possible to provide the well space WE where the color control layer CCR is applied. If an organic material that has a relatively large height and suitably uses high-temperature heat treatment is formed in a subsequent process after the light-emitting layer EML is formed, the light-emitting layer EML may be deteriorated by the high temperature. In addition, if the organic material is cured at a low temperature, it may not be completely cured, and thus outgassing may be derived from the organic material. By using the pixel-defining film PDL and the organic film 172 to provide the well space WE where the color control layer CCR is applied, it is possible to reduce or prevent deterioration of the light-emitting layer EML and outgassing of the organic material.

Subsequently, referring to FIG. 10, a second inorganic film 173 is formed on the organic film 172 to form a thin-film encapsulation structure 170. The second inorganic film 173 may be formed to cover the underlying organic film 172 and the exposed first inorganic film 171.

Subsequently, the color control layer CCR is formed on the thin-film encapsulation structure 170. For example, a first wavelength conversion layer WCL1 is formed in the well structure WE formed in the first emission area LA1, a second wavelength conversion layer WCL2 is formed in the well structure WE formed in the second emission area LA2, and a transparent layer TPL is formed in the well structure WE formed in the third emission area LA3.

The color control layer CCR may be formed via an inkjet printing process or a photoresist process. For example, the first wavelength conversion layer WCL1 may be formed using a solution including a first base resin BRS1, first wavelength-converting particles WCP1 and scattering particles SCP. The second wavelength conversion layer WCL2 may be formed using a solution including a second base resin BRS2, second wavelength-converting particles WCP2, and scattering particles SCP. The transparent layer TPL may be formed using a solution including a third base resin BRS3 and scattering particles SCP.

Subsequently, a first capping layer CPL1 is formed on the color control layer CCR. The first capping layer CPL1 may be formed by stacking a material layer for the first capping layer on the color control layer CCR.

Figure 11:
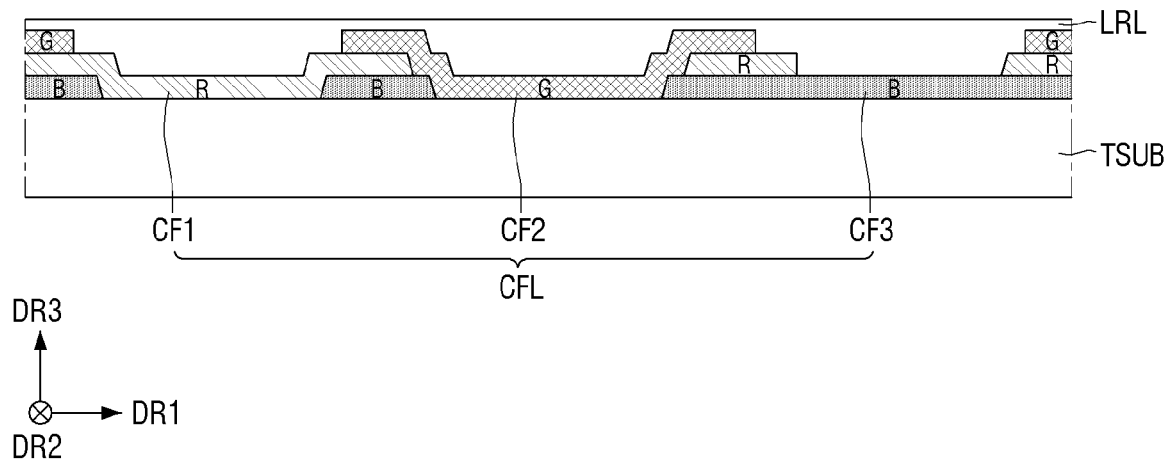

Subsequently, referring to FIG. 11, a second substrate TSUB is prepared, and a color filter layer CFL is formed on the second substrate TSUB. For example, each of a first color filter CF1, a second color filter CF2, and a third color filter CF3 may be formed using a photolithography process. For example, a material layer for the third color filter is applied on the second substrate TSUB, and patterned via a photolithography process, to form the third color filter CF3. Subsequently, a material layer for first color filter is applied on the second substrate TSUB and patterned, to form the first color filter CF1. Subsequently, a material layer for the second color filter may be applied and patterned to form the second color filter CF2.

Subsequently, a low-refractive layer LRL is formed on the color filter layer CFL, and a second capping layer CPL2 is formed thereon. The low-refractive layer LRL may be formed by applying an organic material having a low refractive index via a solution process. The low-refractive layer LRL may be formed to cover the color filter layer CFL. The second capping layer CPL2 may be formed in the same manner as the above-described first capping layer CPL1.

Figure 12:
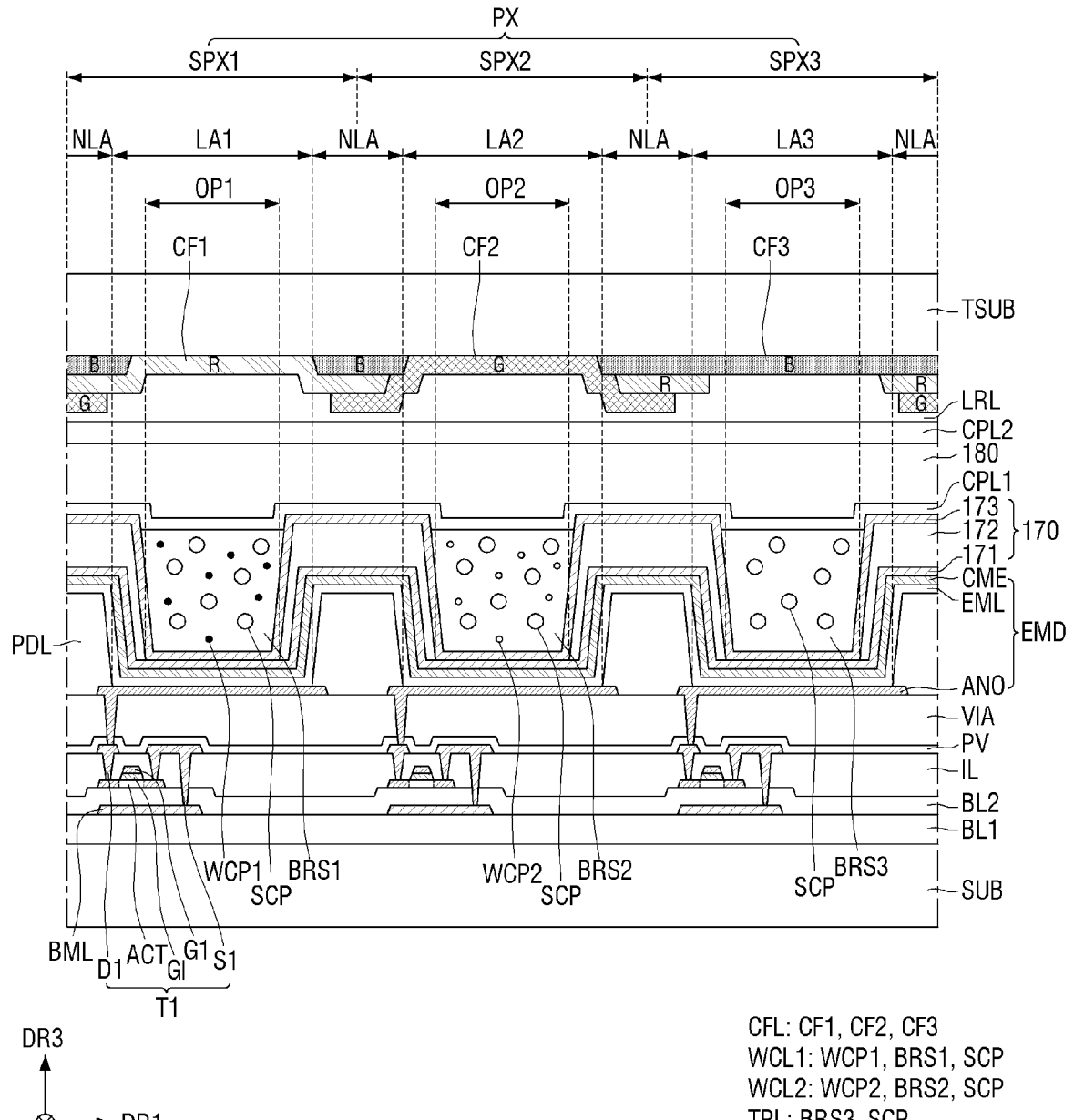

Subsequently, referring to FIG. 12, a filling layer 180 is formed between the first substrate SUB and the second substrate TSUB, and the first substrate SUB and the second substrate TSUB are attached together, so that the display device 10 is completed. The filling layer 180 may be formed between the first capping layer CPL1 formed on the first substrate SUB and the second capping layer CPL2 formed on the second substrate TSUB.

Hereinafter, other embodiments of the present disclosure will be described. In the following description, the same or similar elements will be denoted by the same or similar reference numerals, and redundant descriptions will be omitted or briefly described. Descriptions will focus on the differences from the previously described embodiments.

FIG. 13 is a cross-sectional view showing a pixel of a display device according to one or more other embodiments of the present disclosure.

The one or more embodiments corresponding to FIG. 13 are different from the one or more embodiments corresponding to FIG. 5 in that an organic film 172 is located only on/above a pixel-defining film PDL.

The organic film 172 may be located to overlap the pixel-defining film PDL. The organic film 172 may have a grid shape that is similar to the shape of the pixel-defining film PDL when viewed from the top. The organic film 172 may be located not to cover the side surfaces of the pixel-defining film PDL. As the organic film 172 does not cover the side surfaces of the pixel-defining film PDL, the width (or volume) of the well structure WE formed by each of the openings OP1, OP2, and OP3 of the organic film 172 can be increased. The amount of the color control layer CCR located in the well structure WE can be increased to increase the wavelength conversion efficiency of light.

The organic film 172 may be transparent, but the present disclosure is not limited thereto. It may further include a black pigment. The second inorganic film 173 may be in direct contact with the first inorganic film 171 on the sides of the pixel-defining film PDL.

Figure 14:
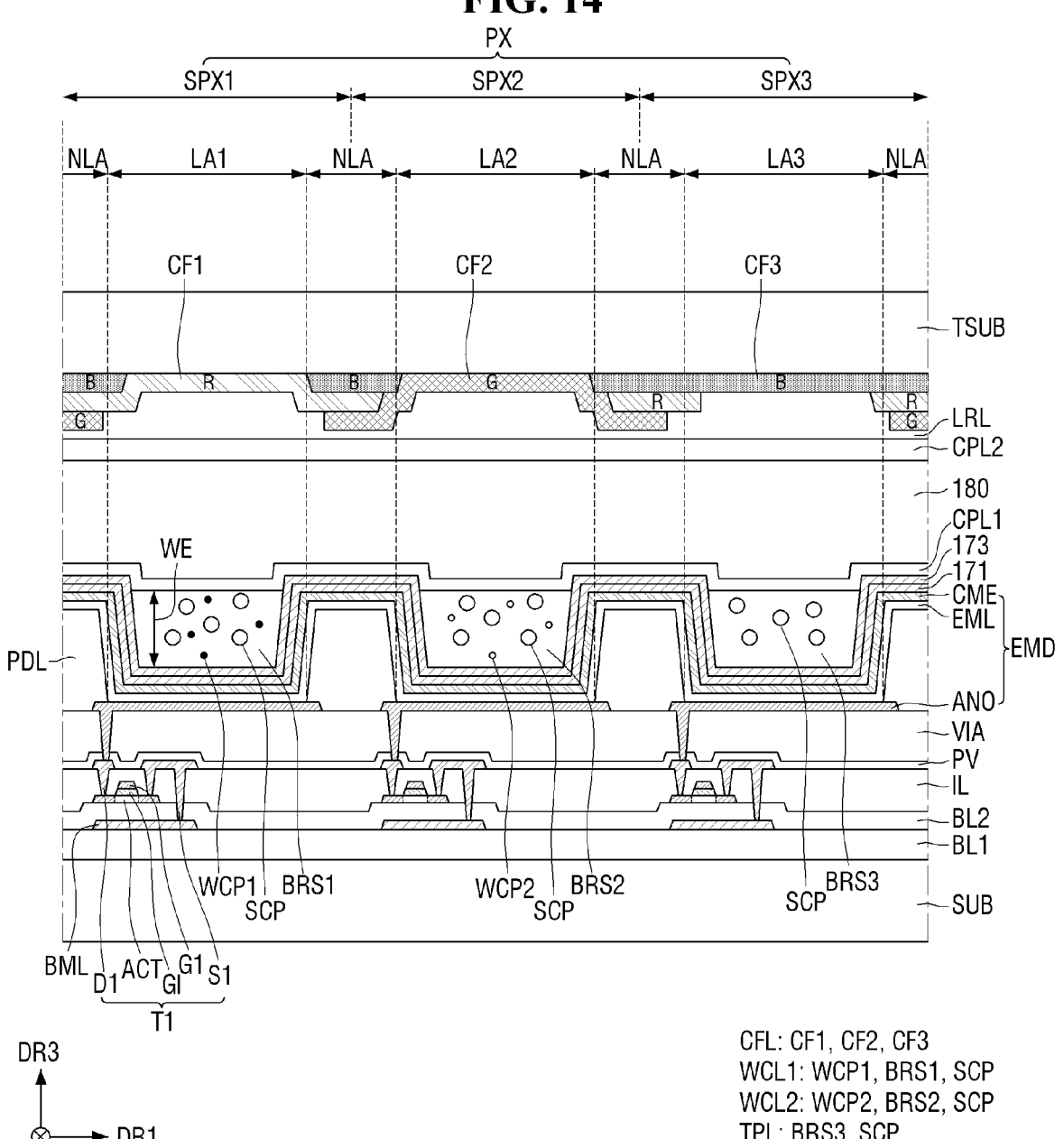
FIG. 14 is a cross-sectional view showing a pixel of a display device according to yet one or more other embodiments of the present disclosure.

FIG. 14 is a cross-sectional view showing a pixel of a display device according to yet one or more other embodiments of the present disclosure.

The one or more embodiments corresponding to FIG. 14 are different from the embodiments of FIGS. 5 and 13 in that an organic film 172 is not located.

For example, a thin-film encapsulation structure 170 may include a first inorganic film 171 and a second inorganic film 173. The first inorganic film 171 may be located on a light-emitting diode EMD, and the second inorganic film 173 may be located on the first inorganic film 171. The second inorganic film 173 may be in direct contact with the entire upper surface of the first inorganic film 171.

The well structure WE may be formed by the pixel-defining film PDL with a relatively large height by eliminating the organic film. A color control layer CCR may be located in the well structure WE. Accordingly, it is possible to save the fabrication cost by omitting the process of fabricating the organic film.

Figure 15:
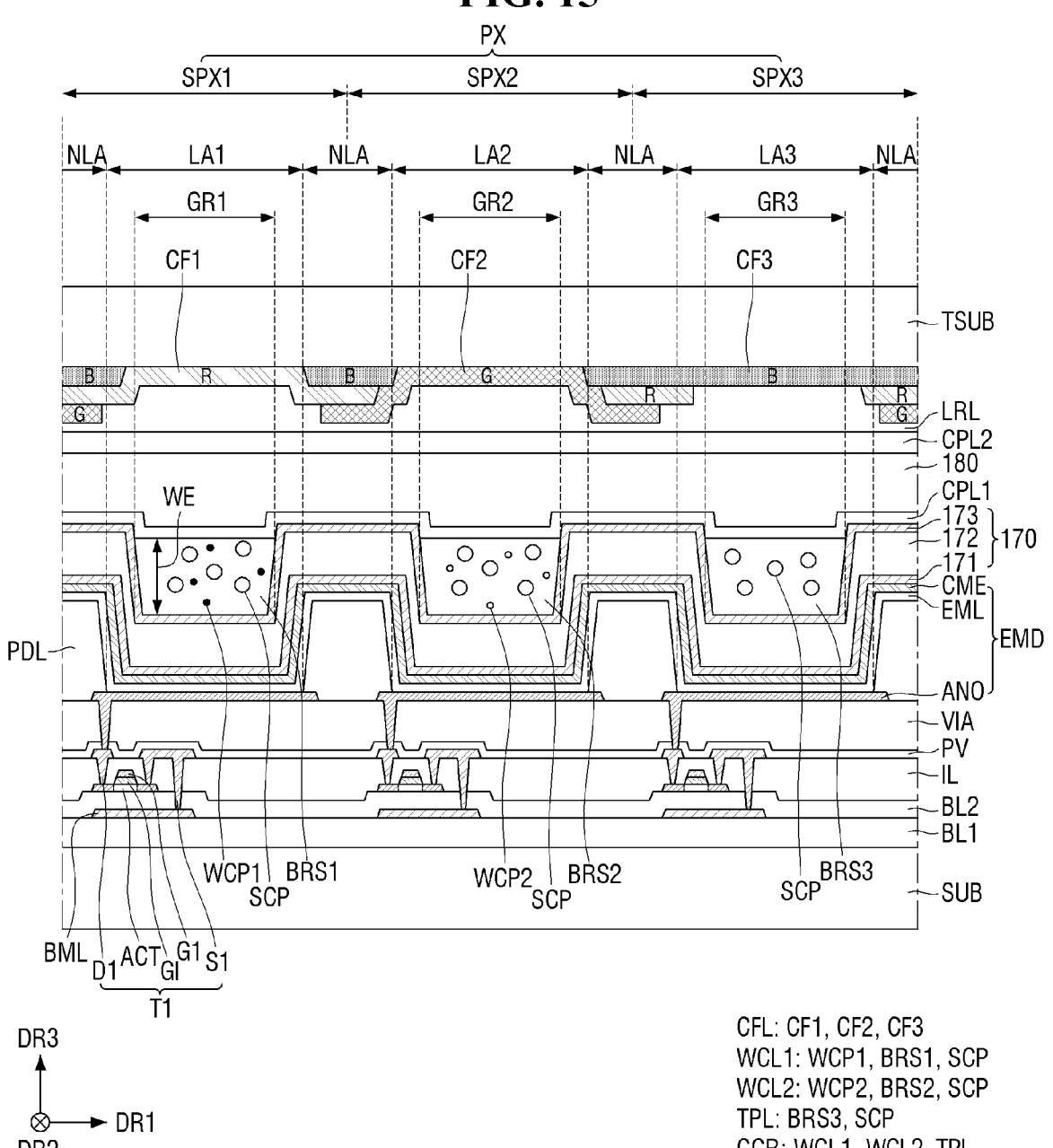
FIG. 15 is a cross-sectional view showing a pixel of a display device according to yet one or more other embodiments of the present disclosure.
Figure 16:
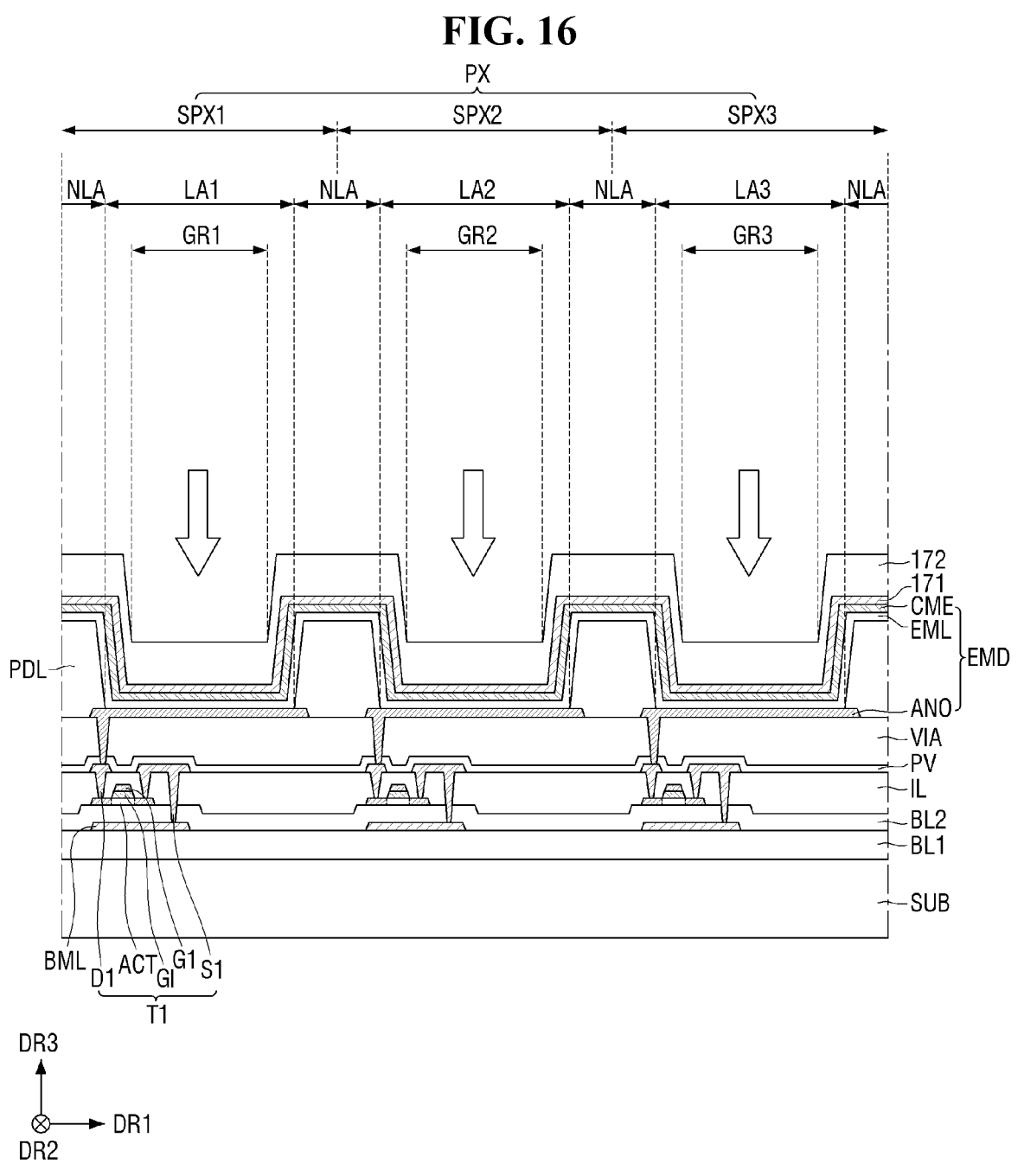

FIG. 15 is a cross-sectional view showing a pixel of a display device according to yet one or more other embodiments of the present disclosure. FIG. 16 is a cross-sectional view showing a process of fabricating the organic film of FIG. 15.

The one or more embodiments corresponding to FIG. 15 are different from the embodiments of FIGS. 5, 13, and 14 in that an organic film 172 includes grooves, or groove areas, GR1, GR2, and GR3 instead of openings.

For example, the thin-film encapsulation structure 170 may include a first inorganic film 171, an organic film 172, and a second inorganic film 173. The organic film 172 may be located entirely on the first inorganic film 171. The organic film 172 may be located such that it overlaps the emission areas LA1, LA2, and LA3 and the non-emission area NLA.

The organic film 172 may include grooves GR1, GR2, and GR3 in line with the emission areas LA1, LA2, and LA3, respectively. The grooves GR1, GR2, and GR3 may include a first groove GR1, a second groove GR2, and a third groove GR3. The first groove GR1 may be located in the first sub-pixel SPX1 and may overlap with the first emission area LA1. The second groove GR2 may be located in the second sub-pixel SPX2 and may overlap with the second emission area LA2. The third groove GR3 may be located in the third sub-pixel SPX3 and may overlap with the third emission area LA3.

Accordingly, each of the grooves GR1, GR2, and GR3 may form a well space WE having a depth from the top surface of the portion of the organic film 172 on the pixel-defining film PDL to the bottom surface of the portion of the organic film 172 overlapping the emission areas LA1, LA2, and LA3. A color control layer CCR, which will be described later, may be located in the well space WE formed by each of the grooves GR1, GR2, and GR3 of the organic film 172.

As shown in FIG. 16, each of the grooves GR1, GR2, and GR3 of the organic film 172 may be formed by applying an organic material layer and then by using a photolithography process. For example, each of the grooves GR1, GR2, and GR3 of the organic film 172 may be formed using a multi-tone mask. It should be understood, however, that the present disclosure is not limited thereto. Each of the grooves GR1, GR2, and GR3 of the organic film 172 may be formed using a laser or a drilling process.

According to one or more embodiments of the present disclosure, by increasing the height of the pixel-defining film PDL, and by forming the grooves GR1, GR2, and GR3 in the organic film 172, it is possible to provide the well space WE where the color control layer CCR is applied. If an organic material, which has a relatively large height and suitably uses a relatively high-temperature heat treatment, is formed in a subsequent process after the light-emitting layer EML is formed, the light-emitting layer EML may be deteriorated by the high temperature. In addition, if the organic material is cured at a low temperature, the organic material may not be completely cured, and thus outgassing may be derived from the organic material. By using the pixel-defining film PDL and the organic film 172 to provide the well space WE where the color control layer CCR is applied, it is possible to reduce or prevent deterioration of the light-emitting layer EML and outgassing of the organic material.

Figure 17:
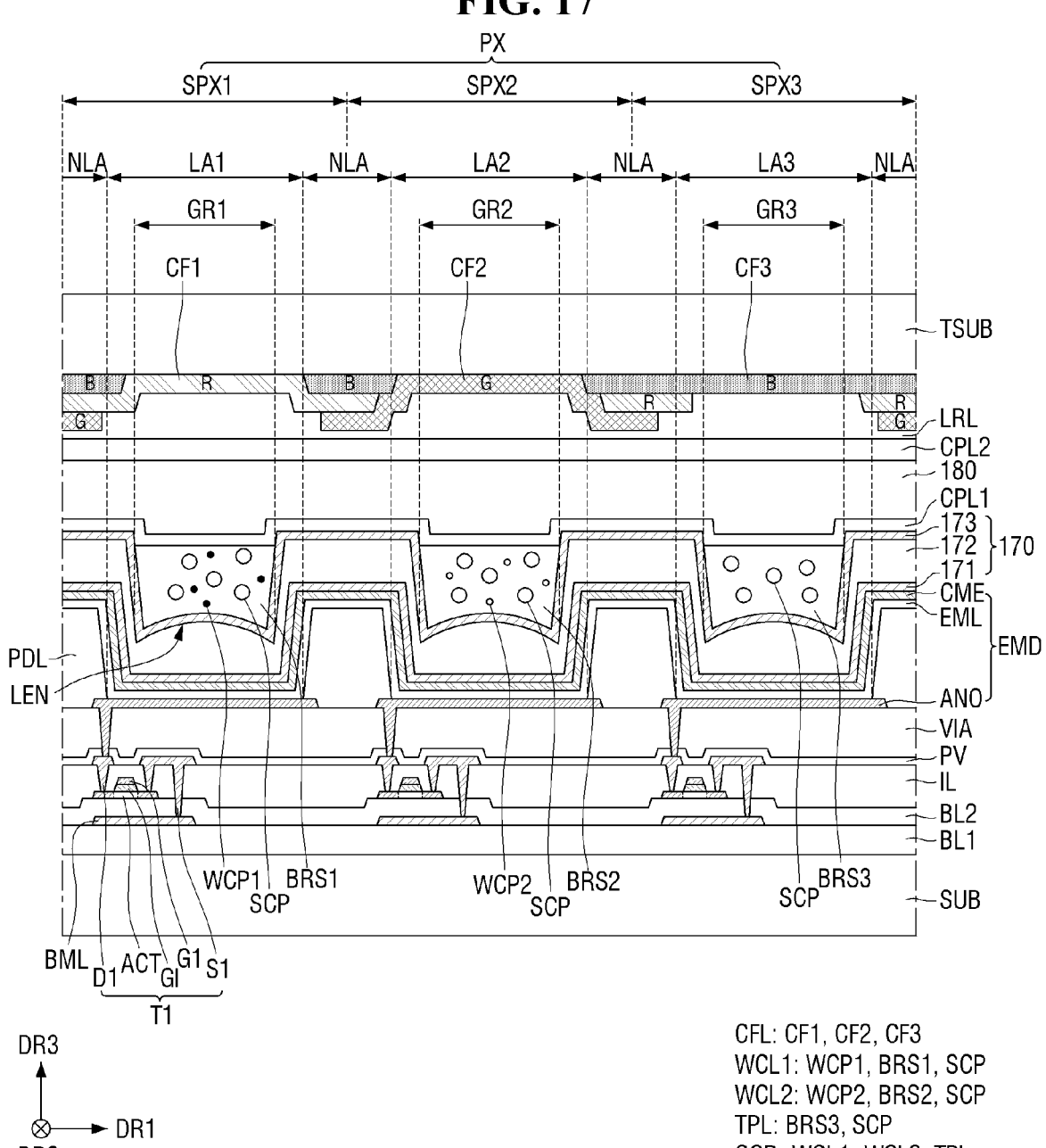
FIG. 17 is a cross-sectional view showing a pixel of a display device according to yet one or more other embodiments of the present disclosure.
Figure 18:
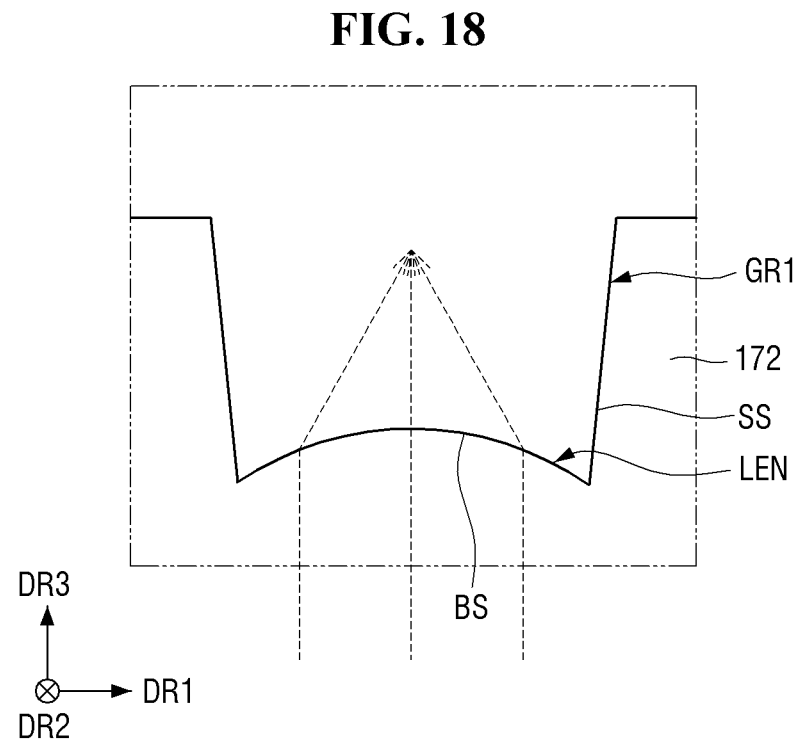
Figure 19:
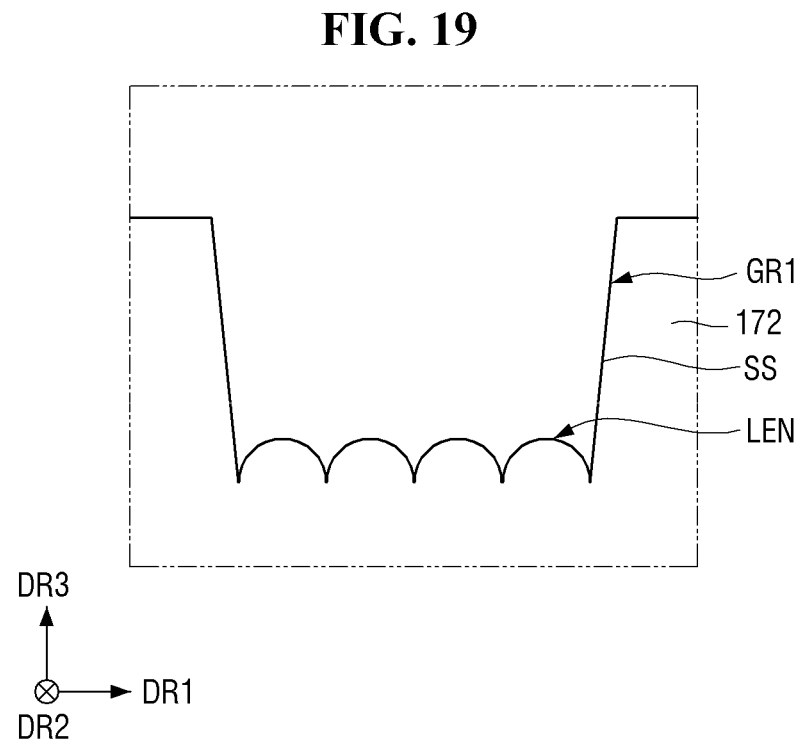

FIG. 17 is a cross-sectional view showing a pixel of a display device according to yet one or more other embodiments of the present disclosure. FIGS. 18 and 19 are cross-sectional views showing examples of grooves in an organic film. FIG. is a cross-sectional view showing a process of fabricating the organic film of FIG. 17.

The one or more embodiments corresponding to FIGS. 17 to 20 are different from the embodiments of FIGS. 5, 13, and 15 in that bottom surfaces BS of grooves GR1, GR2, and GR3 of an organic film 172 respectively include a protrusion LEN.

Each of the grooves GR1, GR2, and GR3 of the organic film 172 may include side surfaces SS and a bottom surface BS. The side surfaces SS may extend generally in the third direction DR3 and may be oblique or curved. The bottom surface BS may extend in a direction crossing the side surfaces SS (e.g., in the first direction DR1). It should be understood, however, that the present disclosure is not limited thereto. The bottom surface BS may be oblique or curved.

The bottom surface BS of each of the grooves GR1, GR2, and GR3 may include at least one protrusion LEN. The at least one protrusion LEN may have a structure protruding toward the third direction DR3 (e.g., protruding upwardly). The protrusion LEN may have a convex hemispherical surface with respect to the bottom surface BS. For example, the protrusion LEN may have a micro lens shape. The micro lens may have different light refraction and condensing characteristics depending on the size (pitch) and density of the lens.

As shown in the drawings, each of the grooves GR1, GR2, and GR3 may have one protrusion LEN in a micro lens shape. The number of the grooves GR1, GR2, and GR3 may be equal to the number of the protrusions LEN. For example, one protrusion LEN may be located in the first groove GR1. The height of the protrusion LEN may be less than the depth of each of the grooves GR1, GR2, and GR3. For example, the height of the protrusion LEN may range from about 10% to about 50% of the depth of each of the grooves GR1, GR2, and GR3. In addition, the area occupied by the protrusion LEN on the bottom surface BS of each of the grooves GR1, GR2, and GR3 may range from about 50% to about 90%, or more. It is, however, to be understood that the present disclosure is not limited thereto.

Light exiting from the light-emitting diode EMD may be incident through the bottom surface BS of each of the grooves GR1, GR2, and GR3 of the organic film 172. The wavelength of the incident light is changed in the color control layer CCR, and then the light is output to the outside through the color filter layer CFL. For example, some of the lights incident on the bottom surface BS of each of the grooves GR1, GR2, and GR3 may be refracted due to the protrusion LEN. That is, some of the lights incident on the bottom surface BS of each of the grooves GR1, GR2, and GR3 may be focused in the third direction DR3, and the other lights may be diffused. Accordingly, by providing the protrusion LEN in each of the grooves GR1, GR2, and GR3, it is possible to condense some lights to improve luminous efficiency. In addition, by diffusing some lights to increase the amount of light reaching the color control layer CCR, the wavelength conversion efficiency can be improved.

As shown in FIG. 19, in one or more other embodiments, a plurality of protrusions LEN in a micro lens shape may be located in each of the grooves GR1, GR2, and GR3. More than one protrusion LEN may be located in each of the grooves GR1, GR2, and GR3. For example, two or more protrusions LEN may be located in the first groove GR1.

Figure 20:
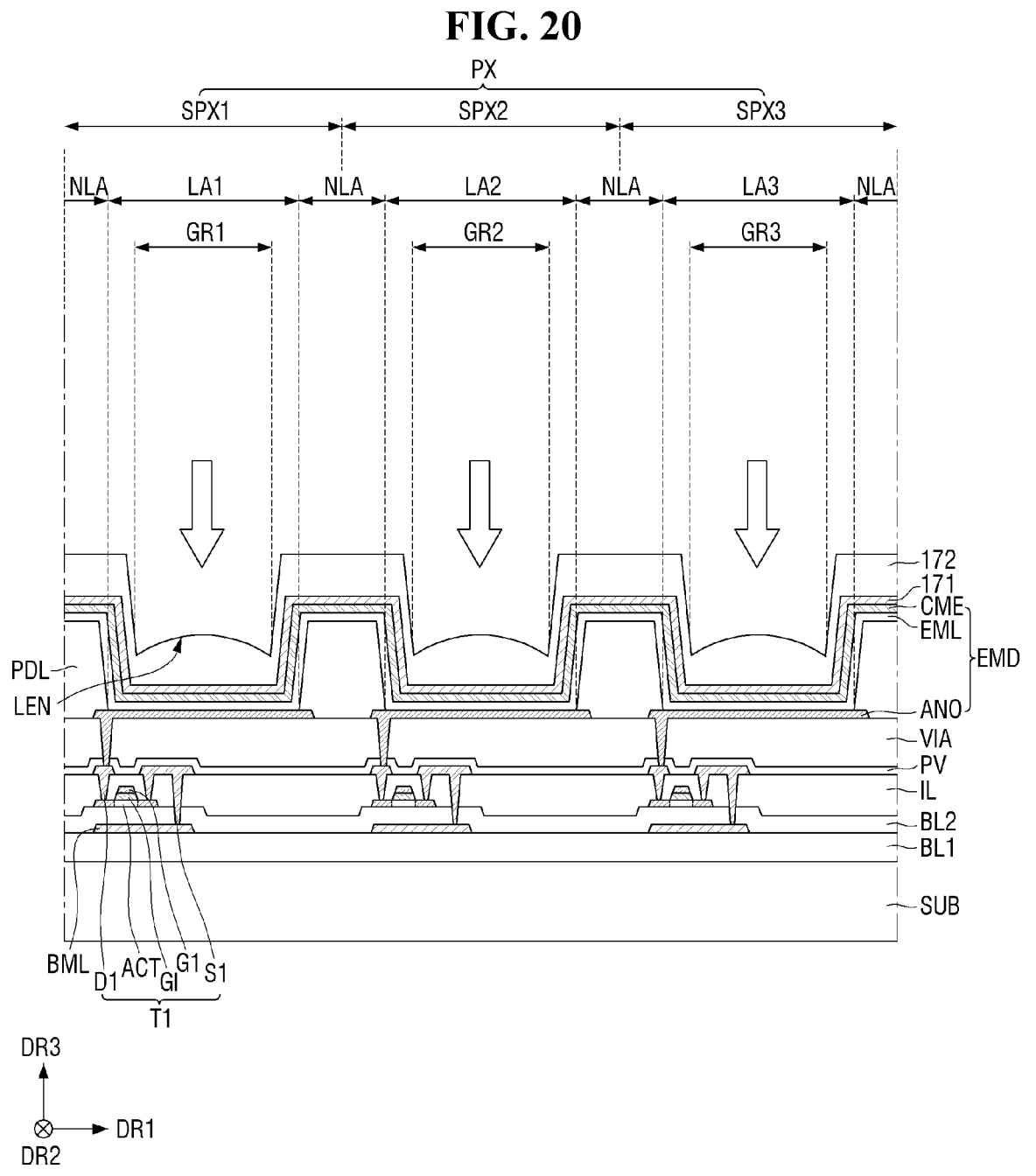

As shown in FIG. 20, the protrusion LEN of each of the grooves GR1, GR2, and GR3 of the organic film 172 may be formed by applying an organic material layer and then by using a photolithography process. For example, the protrusion LEN may be formed in each of the grooves GR1, GR2, and GR3 of the organic film 172 using a multi-tone mask. It should be understood, however, that the present disclosure is not limited thereto. The protrusion LEN of each of the grooves GR1, GR2, and GR3 of the organic film 172 may be formed using a laser or a drilling process.

Figure 21:
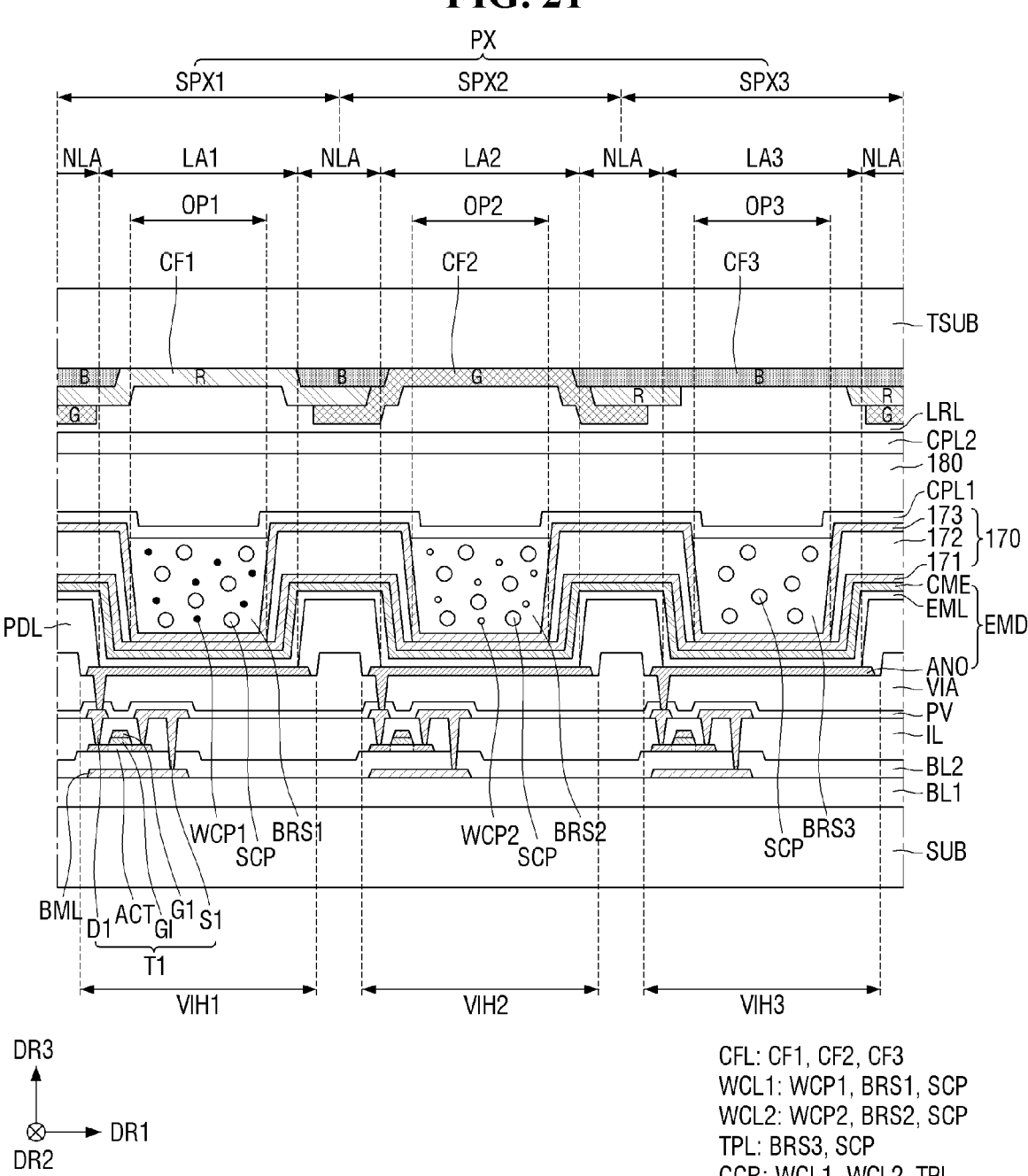
FIG. 21 is a cross-sectional view showing a pixel of a display device according to yet one or more other embodiments of the present disclosure.
Figure 22:
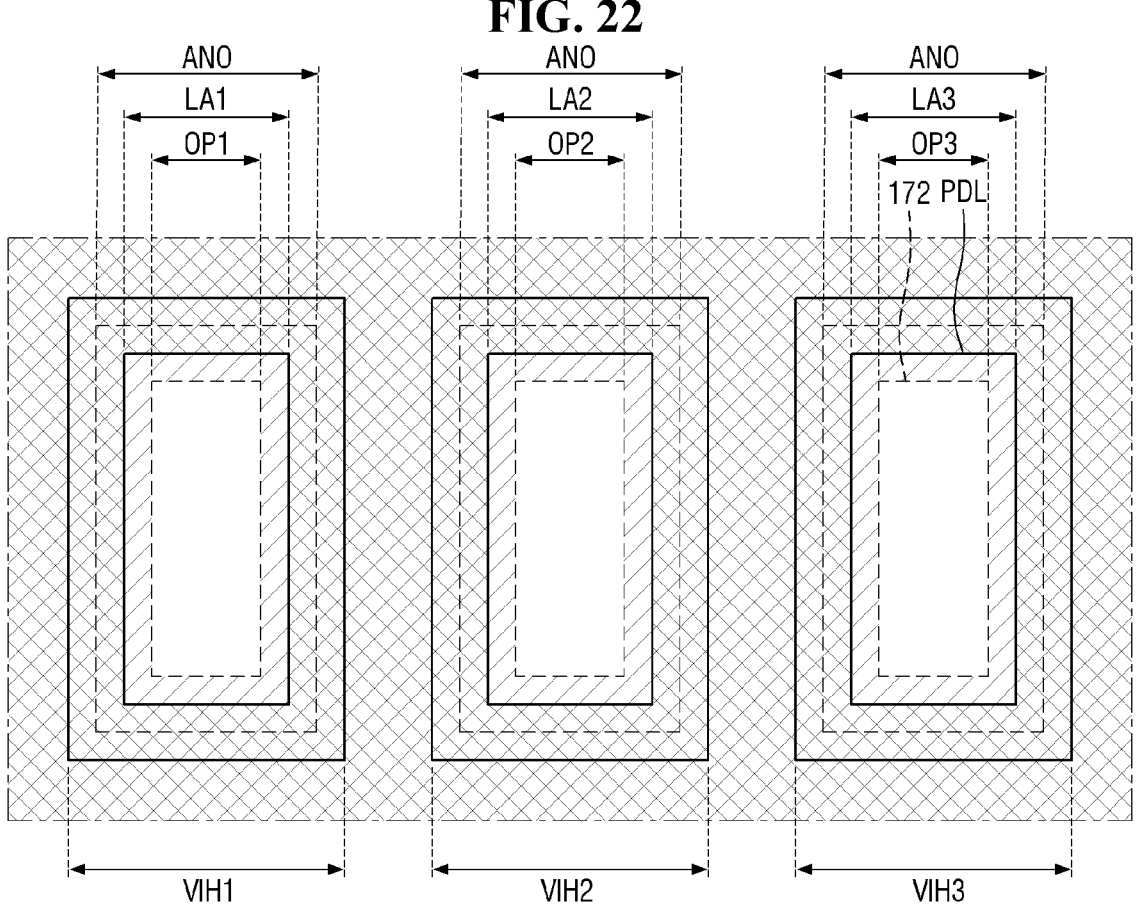
FIG. 22 is a plan view showing one pixel of FIG. 21.
Figure 22:
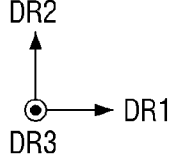
Figure 23:
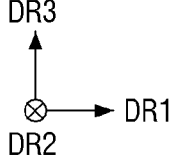
FIG. 23 is a cross-sectional view showing a process of fabricating the via layer and the pixel-defining film of the display device of FIG. 21.

FIG. 21 is a cross-sectional view showing a pixel of a display device according to yet one or more other embodiments of the present disclosure. FIG. 22 is a plan view showing one pixel of FIG. 21. FIG. 23 is a cross-sectional view showing a process of fabricating the via layer and the pixel-defining film of the display device of FIG. 21.

The one or more embodiments corresponding to FIGS. 21 to 23 are different from the embodiments of FIGS. 5, 13, 14, 15, and 17 in that a via layer VIA includes via grooves, or via groove areas, VIH1, VIH2, and VIH3.

For example, the via layer VIA may include via grooves VIH1, VIH2, and VIH3 in line with emission areas LA1, LA2, and LA3, respectively. The via grooves VIH1, VIH2, and VIH3 may include a first via groove VIH1, a second via groove VIH2, and a third via groove VIH3. The first via groove VIH1 may be located in the first sub-pixel SPX1 and may overlap the first emission area LA1. The second via groove VIH2 may be located in the second sub-pixel SPX2, and may overlap the second emission area LA2. The third via groove VIH3 may be located in the third sub-pixel SPX3 and may overlap the third emission area LA3.

Each of the via grooves VIH1, VIH2, and VIH3 may be formed by lowering the height of a portion of the via layer VIA. The first electrodes ANO of the sub-pixels SPX1, SPX2, and SPX3 may be located on the via grooves VIH1, VIH2, and VIH3, respectively. The area of the via groove VIH1, VIH2, and VIH3 may be greater than or equal to the area of the first electrodes ANO of the sub-pixels SPX1, SPX2, and SPX3. For example, the area or width of the first via groove VIH1 in the first direction DR1 may be greater than or equal to the area or width of the first electrode ANO of the first sub-pixel SPX1. In addition, the area of the via grooves VIH1, VIH2, and VIH3 may be greater than the area or width of the emission areas LA1, LA2, and LA3 and the openings OP1, OP2, and OP3 of the organic film 172.

According to one or more embodiments of the present disclosure, as the via layer VIA includes the via grooves VIH1, VIH2, and VIH3, the thickness of the pixel-defining film PDL can be reduced generally by the depth of the via grooves VIH1, VIH2, and VIH3. The thickness of the pixel-defining film PDL where the pixel-defining film PDL overlaps with the non-emission area NLA may be less than the thickness of the pixel-defining film PDL where the thickness of the pixel-defining film PDL overlaps with each of the via grooves VIH1, VIH2, and VIH3 of the via layer VIA. For example, when the depth of each of the via grooves VIH1, VIH2, and VIH3 of the via layer VIA is about 1 μm, and when the thickness of the pixel-defining film PDL formed on the via layer VIA is about 4 μm, the thickness of the pixel-defining film PDL measured from the grooves VIH1, VIH2, and VIH3 may be about 5 μm. In this manner, the thickness of the pixel-defining film PDL can be reduced, and thus the material cost and fabrication cost for the pixel-defining film PDL can be reduced.

As shown in FIG. 23, each of the via grooves VIH1, VIH2, and VIH3 of the via layer VIA may be formed by applying an organic material containing a photosensitive material, and then by exposing and developing the organic material using a multi-tone mask. It should be understood, however, that the present disclosure is not limited thereto. The via layer VIA may be formed by applying an organic material, and then by using a laser or a drilling process.

Figure 24:
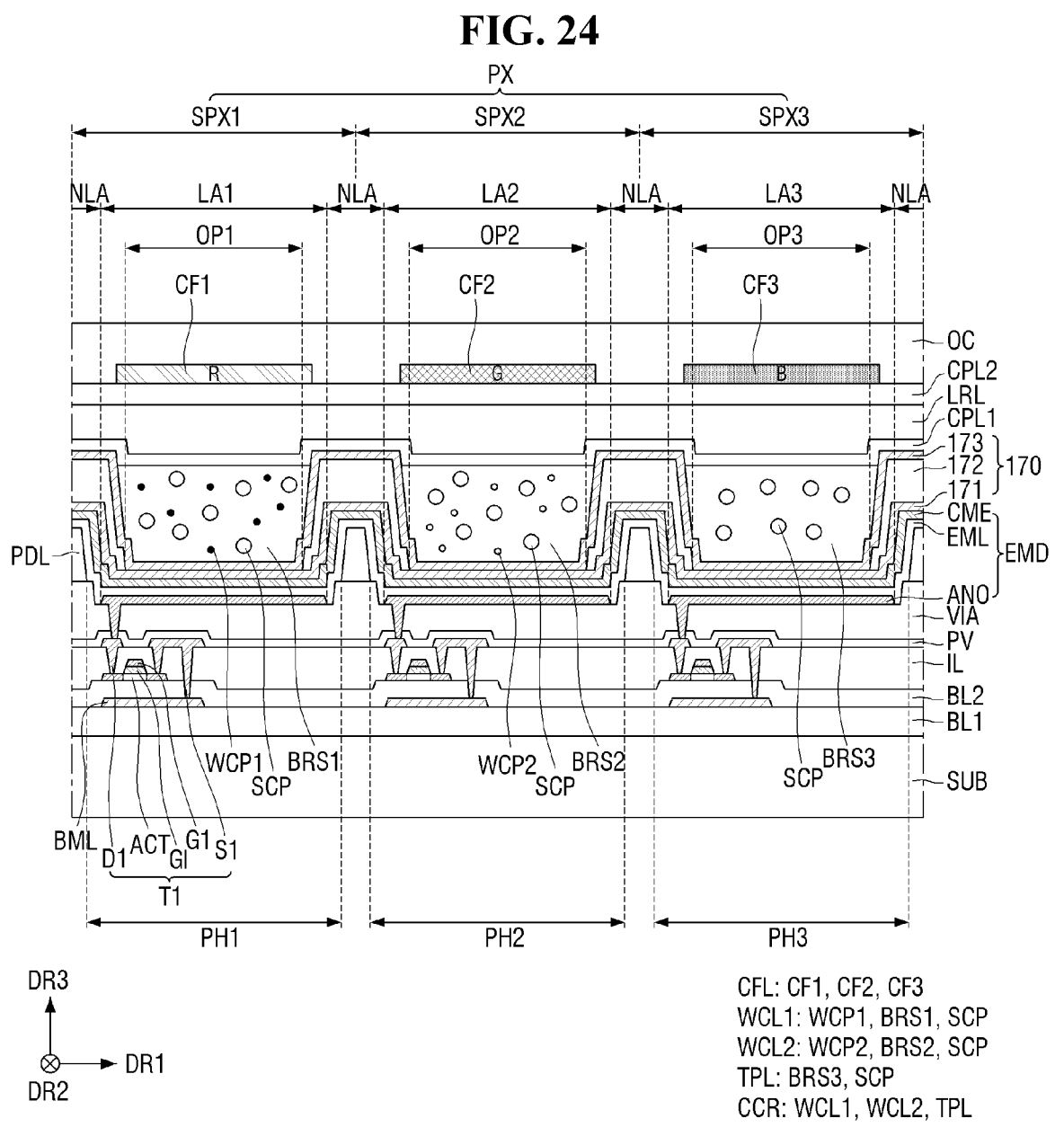
Figure 25:
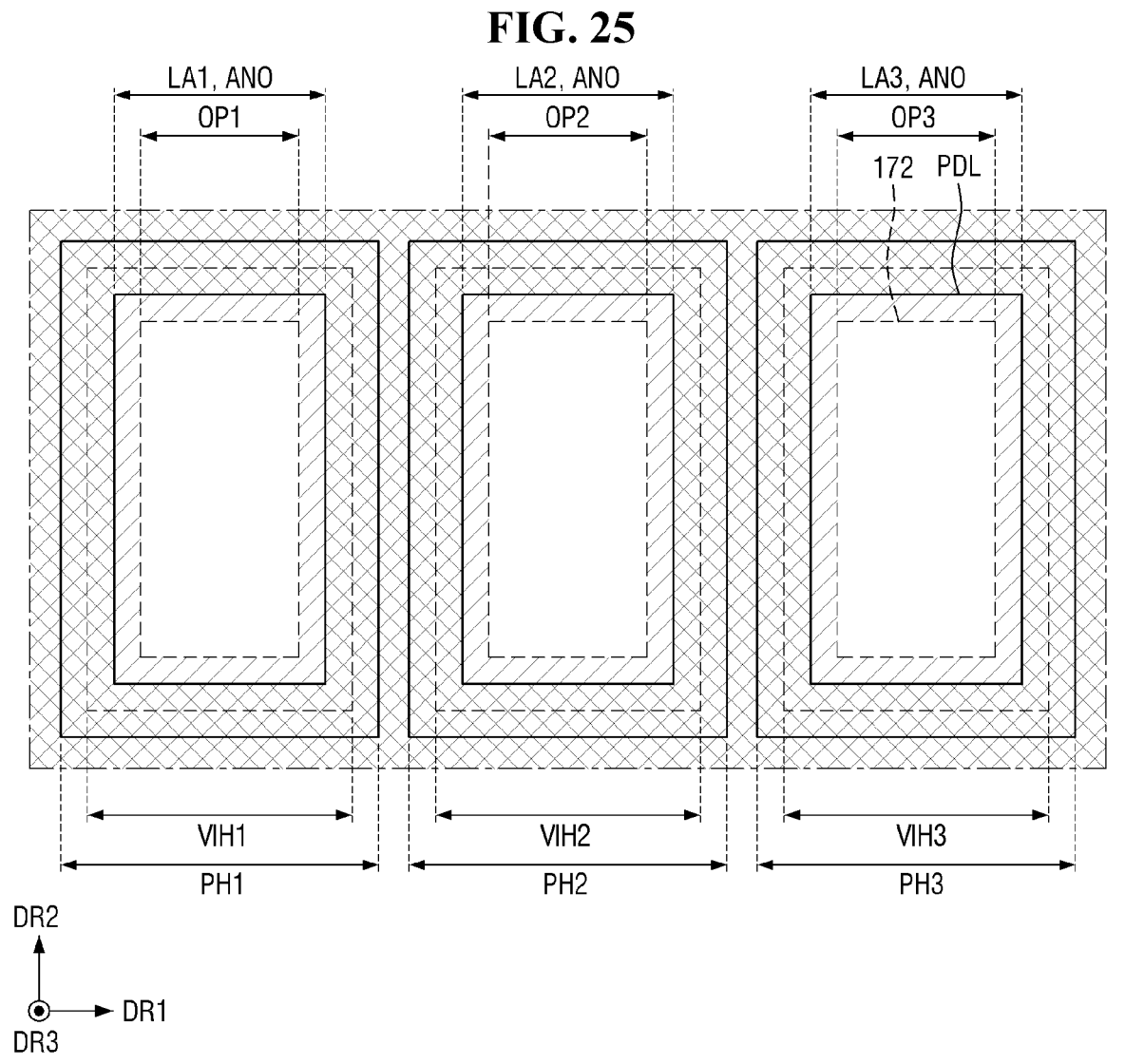
Figure 26:
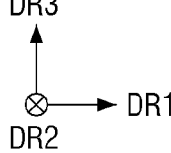
FIG. 26 is a cross-sectional view showing a process of fabricating the pixel-defining film of FIG. 24.

FIG. 24 is a cross-sectional view showing a pixel of a display device according to yet one or more other embodiments of the present disclosure. FIG. 25 is a plan view showing one pixel of FIG. 24. FIG. 26 is a cross-sectional view showing a process of fabricating the pixel-defining film of FIG. 24.

The one or more embodiments corresponding to FIGS. 24 to 26 are different from the embodiments of FIGS. 20 to 22 in that a pixel-defining film PDL does not overlap with via grooves VIH1, VIH2, and VIH3 of a via layer VIA, and the second substrate TSUB is eliminated.

For example, the pixel-defining film PDL may include pixel holes, or pixel hole areas, PH1, PH2, and PH3 that partition sub-pixels SPX1, SPX2, and SPX3, respectively. The pixel holes PH1, PH2, and PH3 may include a first pixel hole PH1, a second pixel hole PH2 and, a third pixel hole PH3. The first pixel hole PH1 may be located in the first sub-pixel SPX1 and may overlap the first emission area LA1. The second pixel hole PH2 may be located in the second sub-pixel SPX2, and may overlap the second emission area LA2. The third pixel hole PH3 may be located in the third sub-pixel SPX3 and may overlap the third emission area LA3.

The pixel holes PH1, PH2, and PH3 may expose first electrodes ANO of the sub-pixels SPX1, SPX2, and SPX3, respectively, and may expose the via grooves VIH1, VIH2, and VIH3 of the via layer VIA, respectively. That is to say, the pixel-defining film PDL may be located such that it does not overlap with the via grooves VIH1, VIH2, and VIH3 of the via layer VIA.

The area of the pixel holes PH1, PH2, and PH3 may be greater than or equal to the area of the via grooves VIH1, VIH2, and VIH3. For example, the area or width of the first pixel hole PH1 in the first direction DR1 may be greater than or equal to the area or width of the first via groove VIH1. In addition, the area of the pixel holes PH1, PH2, and PH3 may be larger than the area or width of the emission areas LA1, LA2, and LA3 and the openings OP1, OP2, and OP3 of the organic film 172. The emission areas LA1, LA2, and LA3 may not be defined by the pixel-defining film PDL, and may be defined as areas in each of which the first electrode ANO, the light-emitting layer EML, and the second electrode CME all overlap one another.

According to one or more embodiments of the present disclosure, when the pixel holes PH1, PH2, and PH3 of the pixel-defining film PDL is greater than the via grooves VIH1, VIH2, and VIH3 of the via layer VIA, the area of the emission areas LA1, LA2, and LA3 of the sub-pixels SPX1, SPX2, and SPX3 may be increased. For example, the area of the emission areas LA1, LA2, and LA3 of the sub-pixels SPX1, SPX2, and SPX3 may be equal to the area of the first electrodes ANO of the sub-pixels SPX1, SPX2, and SPX3. Accordingly, the aperture ratio of the sub-pixels SPX1, SPX2, and SPX3 can be increased.

Incidentally, in the display device 10, a first capping layer CPL1 may be located on a color control layer CCR, and a low-refractive layer LRL may be located on the first capping layer CPL1. A second capping layer CPL2 may be located on the low-refractive layer LRL to protect the low-refractive layer LRL, and a color filter layer CFL may be located directly on the second capping layer CPL2. An overcoat layer OC may be located on the color filter layer CFL to provide a flat surface over the color filter layer CFL.

The color filter layer CFL may be formed directly on a first substrate SUB by eliminating a second substrate TSUB instead of separately placing the color filter layer CFL on the second substrate TSUB. That is to say, a filling layer may be eliminated between the color filter layer CFL and the color control layer CCR, thereby reducing the distance between the color control layer CCR and the color filter layer CFL. Accordingly, the light path in which lights output from the light-emitting diodes EMD pass through the color control layer CCR to reach the color filter layer CFL can be reduced, thereby improving the luminous efficiency.

As shown in FIG. 26, the pixel holes PH1, PH2, and PH3 of the pixel-defining film PDL may be formed by applying an organic material and then by patterning the organic material via a photolithography process. It should be understood, however, that the present disclosure is not limited thereto. The pixel-defining film PDL may be formed by applying an organic material and then by using a laser or a drilling process.

Figure 27:
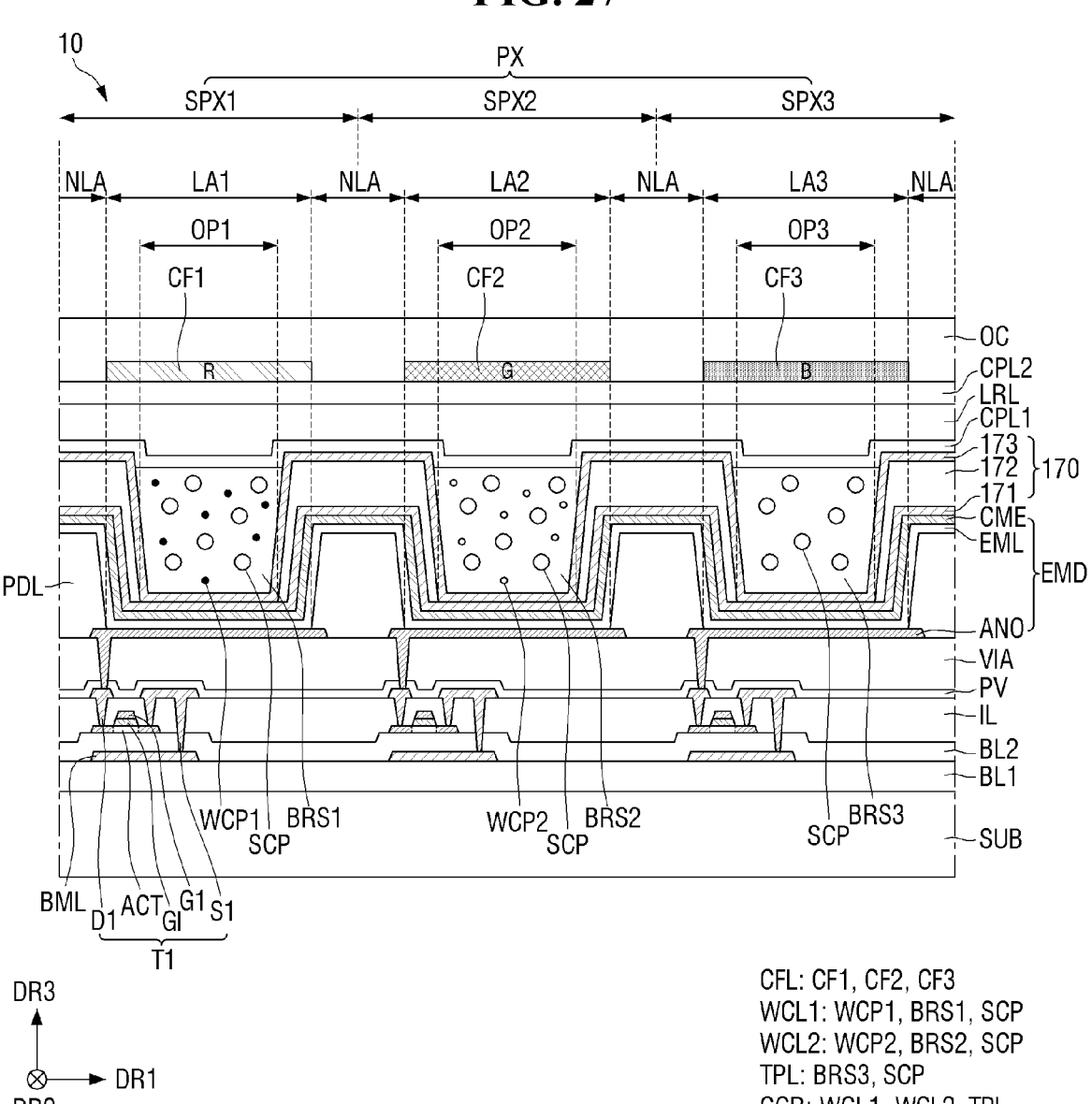
FIG. 27 is a cross-sectional view showing a pixel of a display device according to yet one or more other embodiments of the present disclosure.

FIG. 27 is a cross-sectional view showing a pixel of a display device according to yet one or more other embodiments of the present disclosure.

The one or more embodiments corresponding to FIG. 27 are different from the one or more embodiments corresponding to FIG. 5 in that the second substrate TSUB is eliminated.

For example, in a display device 10, a first capping layer CPL1 may be located on a color control layer CCR, and a low-refractive layer LRL may be located on the first capping layer CPL1. A second capping layer CPL2 may be located on the low-refractive layer LRL to protect the low-refractive layer LRL, and a color filter layer CFL may be located directly on the second capping layer CPL2. An overcoat layer OC may be located on the color filter layer CFL to provide a flat surface over the color filter layer CFL.

The color filter layer CFL may be formed directly on a first substrate SUB by eliminating a second substrate TSUB, instead of separately placing the color filter layer CFL on the second substrate TSUB. That is to say, a filling layer may be eliminated between the color filter layer CFL and the color control layer CCR, thereby reducing the distance between the color control layer CCR and the color filter layer CFL. Accordingly, the light path in which lights output from the light-emitting diodes EMD pass through the color control layer CCR to reach the color filter layer CFL can be reduced, thereby improving the luminous efficiency.

In concluding the detailed description, those skilled in the art will appreciate that many variations and modifications can be made to the disclosed embodiments without substantially departing from the aspects of the present disclosure. Therefore, the disclosed embodiments of the present disclosure are used in a generic and descriptive sense only and not for purposes of limitation.

What is claimed is:
1. A display device comprising:
a first substrate;
a first electrode above the first substrate;
a pixel-defining film above the first electrode, and defining an emission area;

a light-emitting layer above the first electrode and the pixel-defining film;

a second electrode above the light-emitting layer;

a thin-film encapsulation structure above the second electrode such that the second electrode is between the thin-film encapsulation structure and the first substrate in a thickness direction, and comprising an organic film defining an opening; and a color control layer above the thin-film encapsulation structure in the opening.

2. The display device of claim 1, wherein the opening overlaps the emission area, and is smaller than the emission area.

3. The display device of claim 1, wherein the thin-film encapsulation structure further comprises a first inorganic film above the second electrode, and a second inorganic film above the organic film and covering the opening.

4. The display device of claim 3, wherein the opening exposes an upper surface of the first inorganic film that is in contact with the second inorganic film.

5. The display device of claim 3, wherein the opening corresponds to a well space having a depth from an upper surface of the organic film to an upper surface of the first inorganic film.

6. The display device of claim 5, wherein the color control layer is above the second inorganic film in the well space.

7. The display device of claim 1, wherein the organic film covers an upper surface and side surfaces of the pixel-defining film.

8. The display device of claim 1, further comprising a via layer above the first substrate and the first electrode, and defining a via groove overlapping the emission area.

9. The display device of claim 8, wherein an area of the via groove is greater than an area of the emission area and is greater than an area of the opening.

10. The display device of claim 8, wherein the first electrode is in the via groove, and wherein an area of the via groove is greater than or equal to an area of the first electrode.

11. The display device of claim 8, wherein the pixel-defining film defines a pixel hole that exposes the via groove and the first electrode, and is offset from the via groove.

12. The display device of claim 11, further comprising:

a low-refractive layer above the thin-film encapsulation structure;

a capping layer above the low-refractive layer;

a color filter layer above the capping layer; and an overcoat layer above the color filter layer.

13. The display device of claim 1, wherein the color control layer comprises a wavelength conversion layer for converting a wavelength of light, or a transparent layer for transmitting light.

14. The display device of claim 1, further comprising:

a second substrate opposite the first substrate;

a color filter layer above a surface of the second substrate; and a filling layer between the color filter layer and the thin-film encapsulation structure.

15. A display device comprising:

a substrate;

a first electrode above the substrate;

a pixel-defining film above the first electrode, and defining an emission area;

a light-emitting layer above the first electrode and the pixel-defining film;

a second electrode above the light-emitting layer;

a thin-film encapsulation structure above the second electrode such that the second electrode is between the thin-film encapsulation structure and the substrate in a thickness direction, and comprising an organic film defining a groove; and a color control layer above the thin-film encapsulation structure and in the groove.

16. The display device of claim 15, wherein the groove overlaps with the emission area, and corresponds to a well space having a depth from a top surface of the organic film to a bottom surface of the organic film, and wherein the color control layer is in the well space.

17. The display device of claim 16, wherein a bottom surface of the groove comprises at least one protrusion comprising a micro lens shape.

18. A display device comprising:

a substrate;

a pixel-defining film above the substrate, and defining emission areas;

light-emitting elements respectively in the emission areas, and comprising a first electrode, a light-emitting layer, and a second electrode;

a thin-film encapsulation structure above the light-emitting elements such that the light-emitting elements are between the thin-film encapsulation structure and the substrate in a thickness direction, and comprising an organic film having well structures respectively overlapping the emission areas; and a color control layer above the thin-film encapsulation structure and in one or more of the well structures.

19. The display device of claim 18, wherein the well structures correspond to openings or grooves of the organic film.

20. The display device of claim 18, wherein the emission areas comprise a first emission area, a second emission area, and a third emission area, wherein the color control layer comprises a first wavelength conversion layer, a second wavelength conversion layer, and a transparent layer, and wherein the first wavelength conversion layer is in a first one of the well structures of the first emission area, the second wavelength conversion layer is in a second one of the well structures of the second emission area, and the transparent layer is in a third one of the well structures of the third emission area.

* * * * *